United States Patent
Kato et al.

(10) Patent No.: US 9,793,469 B2
(45) Date of Patent: Oct. 17, 2017

(54) MAGNETORESISTIVE ELEMENT AND MAGNETIC MEMORY

(71) Applicant: Kabushiki Kaisha Toshiba, Minato-ku (JP)

(72) Inventors: Yushi Kato, Chofu (JP); Tadaomi Daibou, Yokohama (JP); Yuichi Ohsawa, Yokohama (JP); Shumpei Omine, Meguro (JP); Naoki Hase, Shinagawa (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 15/259,408

(22) Filed: Sep. 8, 2016

(65) Prior Publication Data

US 2016/0380184 A1 Dec. 29, 2016

Related U.S. Application Data

(63) Continuation of application No. PCT/JP2015/056531, filed on Mar. 5, 2015.

(30) Foreign Application Priority Data

Mar. 13, 2014 (JP) ................... 2014-050849

(51) Int. Cl.
*H01L 43/08* (2006.01)
*H01L 43/10* (2006.01)
(Continued)

(52) U.S. Cl.
CPC ............ *H01L 43/08* (2013.01); *H01L 27/228* (2013.01); *H01L 43/02* (2013.01); *H01L 43/10* (2013.01); *H01L 43/12* (2013.01)

(58) Field of Classification Search
CPC .......... H01L 43/02; H01L 43/08; H01L 43/10
See application file for complete search history.

(56) References Cited

U.S. PATENT DOCUMENTS 8,410,529 B2    4/2013 Ikeno et al.
8,520,433 B1    8/2013 Kato et al.
(Continued)

FOREIGN PATENT DOCUMENTS

JP    2009-81216 A    4/2009
JP    2010-232499 A    10/2010
(Continued)

OTHER PUBLICATIONS

International Search Report dated Jun. 2, 2015 in PCT/JP2015/056531 (submitting English language translation only).
(Continued)

*Primary Examiner* — Allison P Bernstein
(74) *Attorney, Agent, or Firm* — Oblon, McClelland, Maier & Neustadt, L.L.P.

(57) ABSTRACT

A magnetoresistive element according to an embodiment includes: a first magnetic layer; a second magnetic layer; a first nonmagnetic layer disposed between the first magnetic layer and the second magnetic layer; a third magnetic layer disposed between the first magnetic layer and the first nonmagnetic layer; and a layer having an amorphous structure, the layer containing two or more elements that are contained in the first magnetic layer, the layer being disposed between the first magnetic layer and the third magnetic layer.

19 Claims, 11 Drawing Sheets

(51) Int. Cl.
    *H01L 43/12*     (2006.01)
    *H01L 27/22*     (2006.01)
    *H01L 43/02*     (2006.01)

(56) References Cited

U.S. PATENT DOCUMENTS

| | | |
|---|---|---|
| 8,680,632 B2 | 3/2014 | Daibou et al. |
| 8,705,269 B2 | 4/2014 | Nagase et al. |
| 2007/0096229 A1* | 5/2007 | Yoshikawa ............. G11C 11/16 257/421 |
| 2009/0080238 A1 | 3/2009 | Yoshikawa et al. |
| 2012/0088125 A1 | 4/2012 | Nishiyama et al. |

FOREIGN PATENT DOCUMENTS

| | | |
|---|---|---|
| JP | 2011-119755 A | 6/2011 |
| JP | 2011-138954 A | 7/2011 |
| JP | 2012-64774 A | 3/2012 |
| JP | 2012-204432 A | 10/2012 |
| JP | 2012-204683 A | 10/2012 |
| JP | 2013-168455 A | 8/2013 |
| JP | 2013-197406 A | 9/2013 |

OTHER PUBLICATIONS

International Preliminary Report on Patentability and Written Opinion dated Sep. 22, 2016 in PCT/JP2015/056531 (submitting English language translation only).
Office Action dated Aug. 16, 2016 in Japanese Patent Application No. 2014-050849 (with English language translation).

* cited by examiner

MAGNETORESISTIVE ELEMENT AND MAGNETIC MEMORY

CROSS REFERENCE TO RELATED APPLICATIONS

This application is a continuation of International Application No. PCT/JP2015/056531, filed on Mar. 5, 2015, which is based upon and claims the benefit of priority from the prior Japanese Patent Application No. 2014-050849, filed on Mar. 13, 2014, the entire contents of which are incorporated herein by reference.

FIELD

Embodiments described herein relate generally to magnetoresistive elements and magnetic memories.

BACKGROUND

Magnetic tunnel junction (MTJ) elements serving as magnetoresistive elements have a multilayer structure including a storage layer, in which the magnetization direction is variable, a reference layer, in which the magnetization direction is unchangeable, and an insulating layer disposed between the storage layer and the reference layer. The MTJ elements are known to have a tunneling magnetoresistive (TMR) effect, and used as storage elements of memory cells in magnetic random access memories (MRAMs).

MRAMs store data ("1", "0") based on changes in relative angle between magnetization directions of magnetic layers included in each MTJ element, and are nonvolatile memories. Since the magnetization may be switched in several nanoseconds, data may be written and read at a high speed. Therefore, the MRAMs are highly expected as next-generation high-speed nonvolatile memories. The cell size of the MRAMs may be reduced by employing spin transfer torque magnetization switching, in which the magnetizations are controlled by means of spin polarized currents. The reduction in cell size may lead to an increase the current density. The increased current density may allow magnetization switching in storage layers to be performed more easily. Therefore, MRAMs with high density and low power consumption may be obtained.

In order to improve the density of nonvolatile memories, the magnetoresistive elements need be integrated more densely. However, thermal stability of ferromagnetic materials, which form the magnetoresistive elements, may be degraded if the entire device size is reduced. Therefore, improvement in the magnetic anisotropy and the thermal stability of the ferromagnetic materials is a problem.

In order to solve this problem, attempts have recently been made to produce MRAMs including perpendicular magnetization MTJ elements, in which the magnetizations of the ferromagnetic materials are perpendicular to the film plane. The magnetic materials to form perpendicular magnetization MTJ elements need to have perpendicular magnetic anisotropy. In order to achieve the perpendicular magnetic anisotropy, materials having crystalline magnetic anisotropy or interface magnetic anisotropy are selected. For example, FePt, CoPt, and FePd have strong crystalline magnetic anisotropy. A number of MTJ elements including an MgO tunnel barrier layer and a layer with interface perpendicular magnetic anisotropy, such as a layer of CoFeB, are reported.

DETAILED DESCRIPTION

Figure 1A:
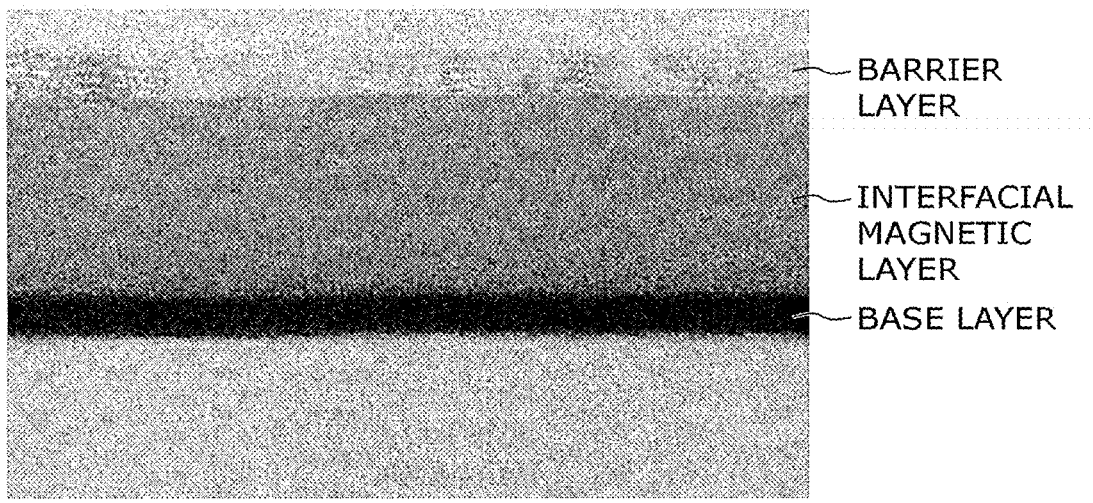
FIGS. 1A and 1B show a TEM image of a section of a multilayer structure including a barrier layer, an interfacial magnetic layer, and a base layer.

A magnetoresistive element according to an embodiment includes: a first magnetic layer; a second magnetic layer; a first nonmagnetic layer disposed between the first magnetic layer and the second magnetic layer; a third magnetic layer disposed between the first magnetic layer and the first nonmagnetic layer; and a layer having an amorphous structure, the layer containing two or more elements that are contained in the first magnetic layer, the layer being disposed between the first magnetic layer and the third magnetic layer.

Embodiments will now be described with reference to the accompanying drawings. In the following descriptions, elements having the same function and the same structure are denoted by the same reference numeral, and a repeated description will be provided only when it is necessary to do so.

Before embodiments are described, how the embodiments have been reached will be described.

In MRAMs employing spin transfer torque to switch magnetization, a critical current for switching magnetization by the spin transfer torque is dependent on the saturation magnetization and the Gilbert damping factor of the storage layer. Therefore, if the magnetization of the storage layer needs to be switched by the spin transfer torque of a low current, the saturation magnetization and the Gilbert damping factor of the storage layer need to be reduced, and the perpendicular magnetic anisotropy and the thermal stability of the storage layer need to be improved.

The inventors produced a magnetoresistive element including a storage layer formed of a material with low saturation magnetization, low Gilbert damping factor, and high perpendicular magnetic anisotropy, and an interfacial layer of CoFeB having high spin polarization. The materials suitable for the storage layer will be described in detail later. As the study proceeded, however, a problem was found in obtaining high magnetoresistive ratio (MR ratio).

If the crystal growth of an interfacial magnetic layer is hindered, high tunneling magnetoresistive (TMR) effect may not be obtained. It is believed that in manufacturing an element having a MgO/CoFeB structure, i.e., an element including an MgO layer formed on an interfacial magnetic layer of CoFeB, first an MgO layer having a good crystallinity is formed on an interfacial magnetic layer of amorphous CoFeB, and then the CoFeB of the interfacial magnetic layer is crystallized during an annealing process, using the crystal of the MgO layer as a template.

There are two points in advancing of crystallizing the interfacial magnetic layer. First, the CoFeB layer needs to be flat and in a completely amorphous state when it is deposited. If the CoFeB layer is in a crystallized state at the time of the deposition, the MgO layer disposed immediately above the CoFeB layer may not be (001) oriented orderly. Second, boron in the CoFeB layer needs to be appropriately diffused. If the diffusion is appropriately performed, the amorphous CoFeB layer may change to a crystallized CoFe layer. A part of boron stays in the CoFe crystal. As a result, the amorphous CoFeB layer changes to a crystallized CoFe (B) layer. CoFe(B) here means that the ferromagnetic layer may contain B besides Co and Fe.

Figure 1B:
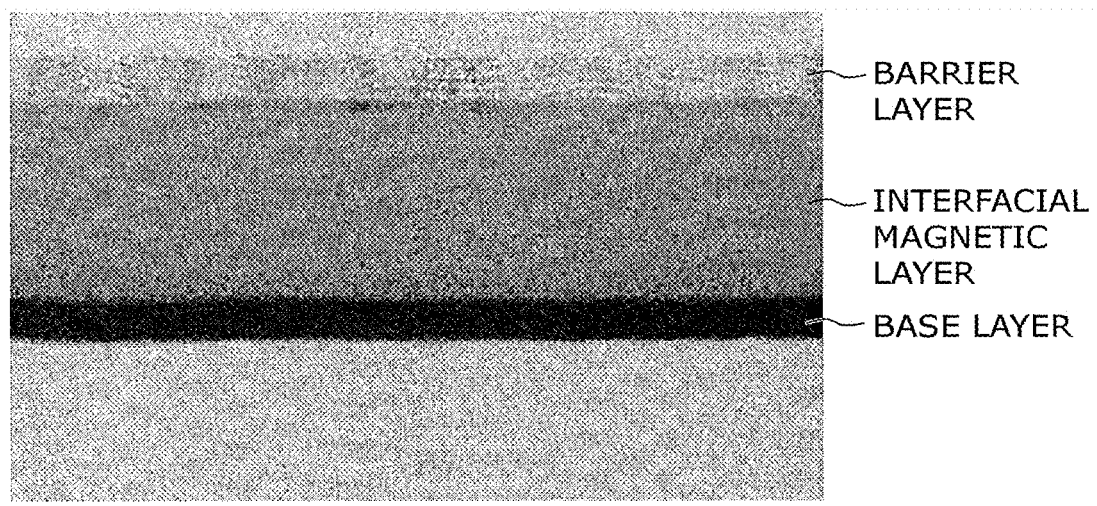

FIGS. 1A and 1B show an example of a transmission electron microscope (TEM) image of a section of a multilayer structure including a barrier layer, an interfacial magnetic layer, and a base layer. FIG. 1A shows a TEM image immediately after the deposition, and FIG. 1B shows a TEM images after a heat treatment at a temperature of 300° C. The barrier layer is formed of MgO, and the interfacial magnetic layer is formed of CoFeB. As can be understood from FIG. 1A, immediately after the deposition, the CoFeB layer has an amorphous structure, and the MgO layer is (001) oriented. As can be understood from FIG. 1B, the heat treatment crystallizes the CoFeB layer from the interface with the MgO layer.

A multilayer structure of MgO barrier layer/CoFeB interfacial magnetic layer/crystalline magnetic layer will then be studied below. The reason why the crystalline magnetic layer is disposed below the interfacial magnetic layer is that the aforementioned magnetic layer with low saturation magnetization, low Gilbert damping factor, and high perpendicular magnetic anisotropy is generally formed of a crystalline material. However, an aspect of the crystal growth of CoFeB differs from an aspect of the crystal growth in the aforementioned case if a crystalline material is disposed below CoFeB, i.e., in the multilayer structure of MgO barrier layer/CoFeB interfacial magnetic layer/crystalline magnetic layer.

Figure 2A:
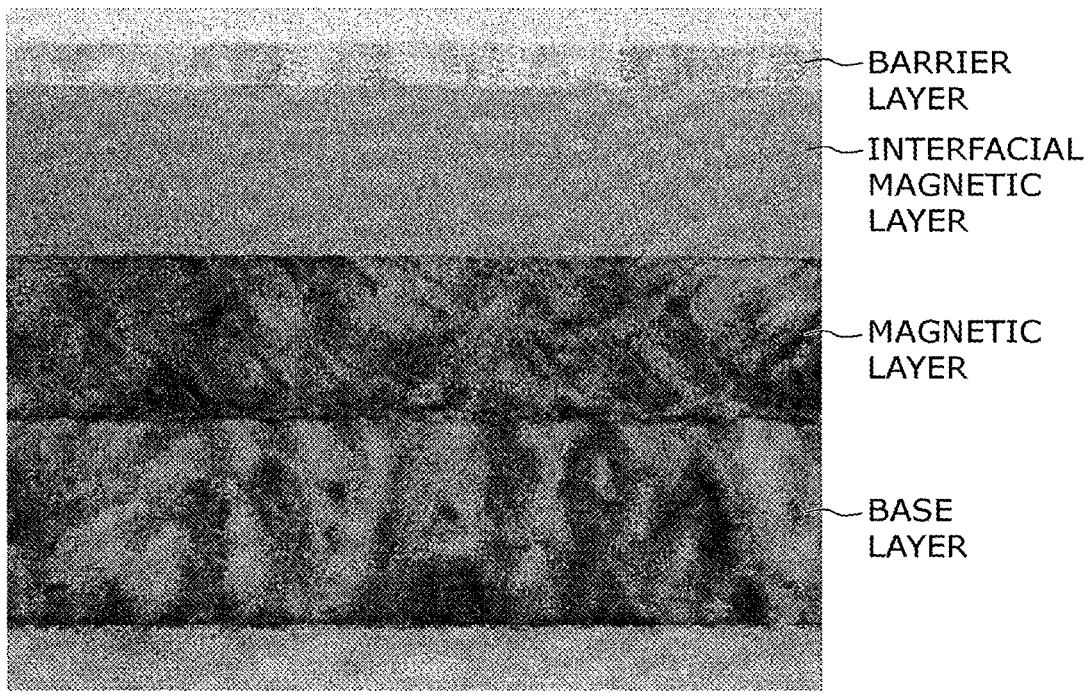
FIGS. 2A and 2B show a TEM image of a section of a multilayer structure including a barrier layer, an interfacial magnetic layer, a crystalline magnetic layer, and a base layer.
Figure 2B:
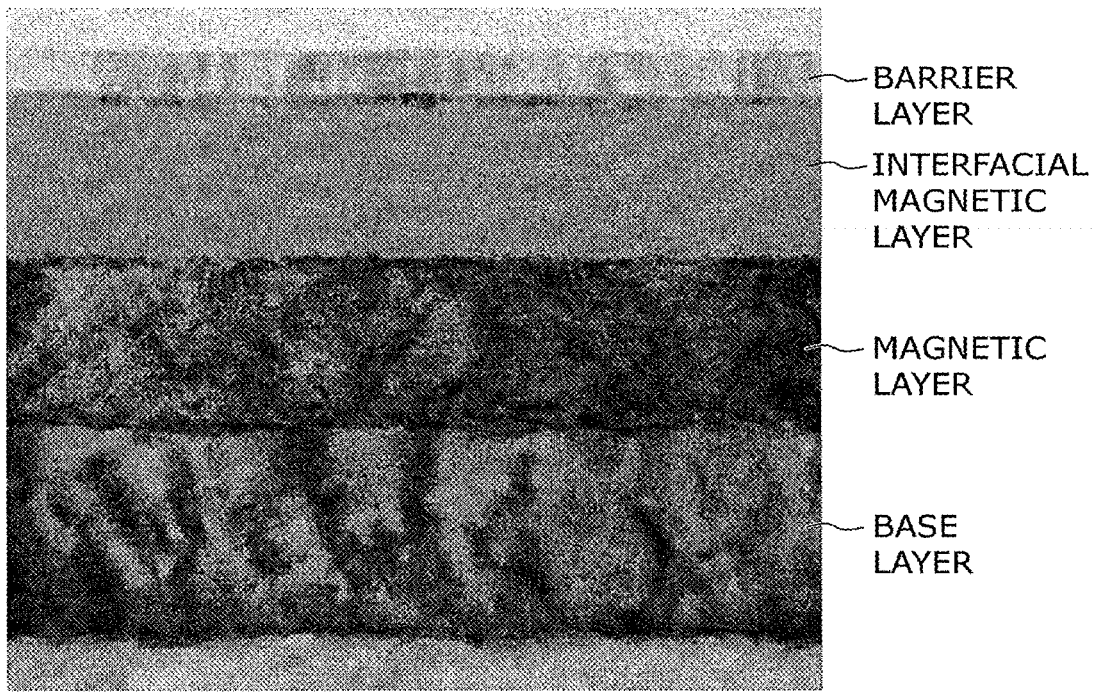

FIGS. 2A and 2B show an example of a TEM image of a section of a multilayer structure including a barrier layer, an interfacial magnetic layer, a crystalline magnetic layer, and a base layer. FIG. 2A shows a TEM image immediately after the deposition, and FIG. 2B shows a TEM image after a heat treatment at a temperature of 300° C. The barrier layer is formed of MgO, and the interfacial magnetic layer is formed of CoFeB. As can be understood from FIG. 2A, immediately after the deposition, the interfacial magnetic layer of CoFeB is in the amorphous state, and the barrier layer of MgO is (001) oriented. As can be understood from FIG. 2B, the heat treatment crystallizes CoFeB of the interfacial magnetic layer from the interface with the barrier layer of MgO, as in the case of FIG. 1B. It may also be understood that the heat treatment crystallizes CoFeB from the interface with the crystalline magnetic layer. In actual magnetoresistive elements, the interfacial magnetic layer preferably is satisfactorily thin. Therefore, the crystallization from both interfaces of the interfacial magnetic layer considerably affects the crystal growth of the interfacial magnetic layer. This indicates that the mechanism of the MgO/CoFeB multilayer structure, which has conventionally provided a high TMR effect, cannot be used in MTJ elements including crystalline materials.

The inventors have studied hard to deal with the aforementioned problem, and have obtained a magnetoresistive element with low saturation magnetization, low Gilbert damping factor, high perpendicular magnetic anisotropy, and high MR ratio, and a magnetic memory including such a magnetoresistive element. Embodiments of such a magnetoresistive element and a magnetic memory will be described below.

(First Embodiment)

Figure 3:
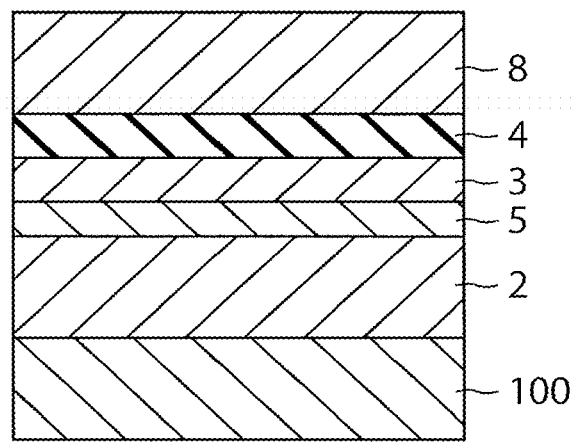
FIG. 3 is a cross-sectional view illustrating a magnetoresistive element according to a first embodiment.

FIG. 3 is a cross-sectional view of a magnetoresistive element 1 according to a first embodiment. The magnetoresistive element 1 according to the first embodiment is an MTJ element, in which a ferromagnetic layer 2, an intermediate layer 5, an interfacial magnetic layer 3, a nonmagnetic layer 4 ("tunnel barrier layer 4"), and a ferromagnetic layer 8 are stacked in this order on a base layer 100.

The base layer 100 is used to control the crystallinity, such as the crystal orientation and the crystal grain size, of the ferromagnetic layer 2 and the layers above the ferromagnetic layer 2. The details of the characteristics of the base layer 100 will be described later. The ferromagnetic layer 2 is a magnetic layer containing a least one element selected from the group consisting of Mn, Al, Ge, and Ga. The interfacial magnetic layer 3 is a magnetic layer containing at least one element selected from the group consisting of Co, Fe, and Ni.

The resistance value of the MTJ element 1 is determined by the angle between magnetization directions of two ferromagnetic layers 2 and 8 disposed with the tunnel barrier layer 4 sandwiched therebetween. The angle between magnetization directions may be controlled by an external magnetic field or a current flowing through the MTJ element 1. The angle between magnetization directions may be controlled more stably by causing a difference in value of the coercive field Hc, the anisotropy magnetic field Hk, or the Gilbert damping factor α between the two ferromagnetic layers 2 and 8. The ferromagnetic layer with a greater coercive field Hc, anisotropy magnetic field Hk, or Gilbert damping factor α is called "reference layer," and the ferromagnetic layer with a smaller coercive field Hc, anisotropy magnetic field Hk, or Gilbert damping factor a is called "storage layer" herein. Generally, the ferromagnetic layer used as a reference layer preferably has a greater coercive field Hc, anisotropy magnetic field Hk, or Gilbert damping factor α, and the ferromagnetic layer used as a storage layer preferably has a smaller coercive field Hc, anisotropy magnetic field Hk, or Gilbert damping factor α. A ferromagnetic layer containing Mn and at least one element selected from the group consisting of Al, Ge, and Ga is suitable for use as a storage layer since the saturation magnetization, the polarizability, the coercive field, and the anisotropy magnetic field of the layer may be controlled by the elements included, as will be described later, and such a layer has low Gilbert damping factor.

The c-axis of the magnetic film used as the ferromagnetic layer 2 of the first embodiment is the easy magnetization axis. A perpendicular magnetization MTJ element may be produced by controlling the orientation of crystal so that the c-axis is perpendicular to the film plane. The "film plane" herein means a plane that is perpendicular to the stacking direction.

In the first embodiment, the nonmagnetic layer 4 is preferably formed of an oxide insulating material such as MgO. The interfacial magnetic layer 3 is preferably formed of a material having tunneling electron selectivity with respect to the nonmagnetic layer 4 and a high spin polarization, such as CoFeB. The materials of the nonmagnetic layer 4 and the interfacial magnetic layer 3 will be described later.

In the first embodiment, the intermediate layer 5 is preferably formed of an amorphous material, of which two or more elements are the same as those in the material of the ferromagnetic layer 2. The method of forming the intermediate layer 5 will be described later. If two or more elements are common to the intermediate layer 5 and the ferromagnetic layer 2, the wettability at the interface between the intermediate layer 5 and the ferromagnetic layer 2 may be improved, and therefore the flatness of the intermediate layer 5 may also be improved. The flatness of the intermediate layer 5 may lead to the flatness of the interfacial magnetic layer 3 that is immediately above the intermediate layer 5 and the nonmagnetic layer (tunnel barrier layer) 4 that is above the intermediate layer 5. As a result, the interface between the interfacial magnetic layer 3 and the tunnel barrier layer 4, and the interface between the tunnel barrier layer 4 and the magnetic layer disposed immediately above the tunnel barrier layer 4 may be ideally formed without irregularity, which brings about a high MR ratio. The intermediate layer 5 is preferably thick enough to be an amorphous layer, and satisfactorily thin so that the magnetic coupling between the ferromagnetic layer 2 and the interfacial magnetic layer 3 is not broken. From this viewpoint, the intermediate layer 5 preferably has a thickness in a range from 0.1 nm to 5 nm.

The significance of the amorphous intermediate layer 5 will be described below. If the intermediate layer 5 is an amorphous layer, the interfacial magnetic layer 3 that is disposed immediately above the intermediate layer 5 may grow as an amorphous layer without being affected by the crystal orientation of the crystalline magnetic layer 2. The nonmagnetic layer 4 is formed of a material having strong self-orientation, and therefore grows to have a good crystallinity on the amorphous interfacial magnetic layer 3. Annealing performed thereafter crystallizes the interfacial magnetic layer 3 with the crystalline nonmagnetic layer being used as a template. At this time, the epitaxial relationship between the nonmagnetic layer 4 and the interfacial magnetic layer 3 is maintained. If the intermediate layer 5 is not an amorphous layer, the interfacial magnetic layer 3 disposed immediately above the intermediate layer 5 is subjected to the influence of the crystal orientation of the crystalline magnetic layer 2 and the intermediate layer 5 when it is deposited or annealed. This may prevent the interfacial magnetic layer 3 from having desired orientation. The nonmagnetic layer 4 that grows under the influence of the interfacial magnetic layer 3 may also have undesired crystal orientation with respect to the selectability of tunneling electrons. For the above reasons, the intermediate layer 5 preferably is an amorphous layer.

If an MTJ element has a multilayer structure including a ferromagnetic layer 2 of MnGa, an intermediate layer 5 of amorphous MnGa, an interfacial magnetic layer 3 of CoFe (B), a nonmagnetic layer 4 of crystalline MgO, and a ferromagnetic layer 8 of MnGa stacked in this order, an orientation relationship of MnGa(001)/MgO(001)/CoFe(B)(001)/amorphous intermediate layer/MnGa(001) may be obtained. CoFe(B) means that the ferromagnetic layer may contain B besides Co and Fe. MnGa(001) and MgO(001) mean that crystal is oriented to expose the (001) surface on the top. This improves the wave number selection of the tunneling electrons to obtain a high MR ratio.

As described above, according to the first embodiment, a high MR ratio magnetoresistive element including magnetic layers having low saturation magnetization, low Gilbert damping factor, and high perpendicular magnetic anisotropy may be obtained.

The easy magnetization directions of the ferromagnetic layer 2 and the ferromagnetic layer 8 may be oriented to be perpendicular to the film plane by controlling the crystal orientation characteristic, i.e., the direction of the crystal orientation, of these materials. Thus, the magnetoresistive element according to the first embodiment may become an in-plane magnetization MTJ element in which the magnetization directions of the ferromagnetic layer 2 and the ferromagnetic layer 8 are parallel to the film plane, or a perpendicular magnetization MTJ element in which the magnetization directions of the ferromagnetic layers are perpendicular to the film plane by appropriately controlling the crystal orientation characteristics of these layers. An "easy magnetization direction" means a direction in a ferromagnetic material with a certain macro size. If a spontaneous magnetization is along this direction in a state where there is no external magnetic field, the internal energy becomes the lowest. A "hard magnetization direction" also means a direction of a ferromagnetic material with a certain macro size. If a spontaneous magnetization is along this direction in a state where there is no external magnetic field, the internal energy becomes the highest.

In one of the ferromagnetic layer 2 and the ferromagnetic layer 8, the direction of magnetization is not changed after a write current is caused to flow through the MTJ element, and in the other, the direction of magnetization may be changed. The ferromagnetic layer with unchangeable magnetization direction is also called "reference layer," and the ferromagnetic layer with changeable magnetization is also called "storage layer." In the first embodiment, the ferromagnetic layer 2 is the storage layer, and the ferromagnetic layer 8 is the reference layer, for example. The interfacial magnetic layer 3 is disposed to improve the spin polarization.

A write current is caused to flow between the ferromagnetic layer 2 and the ferromagnetic layer 8 in a direction perpendicular to the film plane. If the ferromagnetic layer 2 is the storage layer and the ferromagnetic layer 8 is the reference layer, and the direction of magnetization of the ferromagnetic layer 2 and the direction of magnetization of the ferromagnetic layer 8 are antiparallel to (opposite to) each other, a write current is caused to flow from the ferromagnetic layer 2 to the ferromagnetic layer 8. In this case, electrons flow from the ferromagnetic layer 8 to the ferromagnetic layer 2 via the nonmagnetic layer 4. Therefore, electrons that are spin-polarized in the ferromagnetic layer 8 flow into the ferromagnetic layer 2. The spin-polarized electrons having the spin in the same direction as the magnetization of the ferromagnetic layer 2 pass through the ferromagnetic layer 2. However, the spin-polarized electrons having the spin in the opposite direction exert the spin torque on the direction of magnetization of the ferromagnetic layer 2 so that the direction becomes the same as the direction of magnetization of the ferromagnetic layer 8. As a result, the direction of magnetization of the ferromagnetic layer 2 is switched, and becomes parallel to (in the same direction as) the direction of magnetization of the ferromagnetic layer 8. The ferromagnetic layer 2 and the interfacial magnetic layer 3 are preferably coupled with each other via the intermediate layer 5. In this case, the magnetization direction of the interfacial magnetic layer 3 is switched together with the magnetization direction of the ferromagnetic layer 2.

If the direction of magnetization of the ferromagnetic layer 2 and the direction of magnetization of the ferromagnetic layer 8 are parallel to each other, a write current is caused to flow from the ferromagnetic layer 8 to the ferromagnetic layer 2.

In this case, electrons flow from the ferromagnetic layer 2 to the ferromagnetic layer 8 via the nonmagnetic layer 4. Electrons spin-polarized in the ferromagnetic layer 2 flow into the ferromagnetic layer 8. The spin-polarized electrons having the spin in the same direction as the direction of magnetization of the ferromagnetic layer 8 pass through the ferromagnetic layer 8. However, the spin-polarized electrons having the spin in the opposite direction to the direction of magnetization of the ferromagnetic layer 8 are reflected at the interface between the nonmagnetic layer 4 and the ferromagnetic layer 8, and flow into the ferromagnetic layer 2 via the nonmagnetic layer 4. As a result, spin torque is exerted on the magnetization of the ferromagnetic layer 2, so that the direction of magnetization of the ferromagnetic layer 2 becomes opposite to the direction of magnetization of the ferromagnetic layer 8. Thus, the direction of magnetization of the ferromagnetic layer 2 is switched and becomes antiparallel to the direction of magnetization of the ferromagnetic layer 8. Preferably, the ferromagnetic layer 2 and the interfacial magnetic layer 3 are magnetically coupled with each other via the intermediate layer 5. In this case, the direction of magnetization of the interfacial magnetic layer 3 is reversed together with that of the ferromagnetic layer 2.

Although the ferromagnetic layer 2 is the storage layer, the ferromagnetic layer 8 is the reference layer, and the interfacial magnetic layer 3 is disposed on the storage layer side in the first embodiment, the roles of the layers are not limited to this case. Therefore, the ferromagnetic layer 2 may be the reference layer, the ferromagnetic layer 8 may be the storage layer, and the interfacial magnetic layer 3 may be disposed on the reference layer side.

(Second Embodiment)

Figure 4:
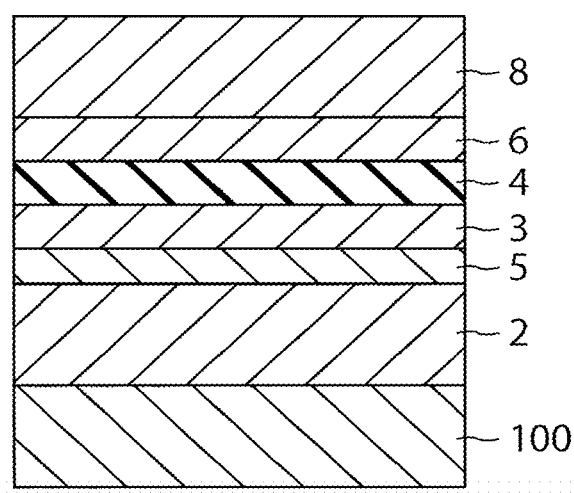
FIG. 4 is a cross-sectional view illustrating a magnetoresistive element according to a second embodiment.

FIG. 4 shows a magnetoresistive element 1A according to a second embodiment. The magnetoresistive element 1A is obtained by disposing an interfacial magnetic layer 6 between the nonmagnetic layer 4 and the ferromagnetic layer 8 of the magnetoresistive element 1 according to the first embodiment shown in FIG. 3. For example, the ferromagnetic layer 2 contains Mn and at least one element selected from Al, Ge, and Ga, and the interfacial magnetic layer 3 is a ferromagnetic layer containing at least one element selected from Co, Fe, and Ni. The intermediate layer 5 is an amorphous layer containing two or more elements that are also contained in the ferromagnetic layer 2. The details of the interfacial magnetic layer 6 will be described later.

As in the first embodiment, the ferromagnetic layer 2 and the ferromagnetic layer 8 may be caused to have a magnetic anisotropy perpendicular to the film plane with the easy magnetization direction being oriented to be perpendicular to the film plane by controlling the crystal orientation of these ferromagnetic layers. Therefore, the magnetoresistive element 1A according to the second embodiment may be a perpendicular magnetization MTJ element in which the magnetization directions of the ferromagnetic layer 2 and the ferromagnetic layer 8 are perpendicular to the film plane, as well as an in-plane magnetization MTJ element. The direction of magnetization of one of the ferromagnetic layer 2 and the ferromagnetic layer 8 is not changed after a write current is caused to flow through the MTJ element 1A, and the direction of magnetization of the other may be changed. In the second embodiment, the ferromagnetic layer 2 is the storage layer, and the ferromagnetic layer 8 is the reference layer, for example. The write current is caused to flow between the ferromagnetic layer 2 and the ferromagnetic layer 8 in a direction perpendicular to the film plane, as in the first embodiment. The interfacial magnetic layer 3 that is magnetically coupled with the ferromagnetic layer 2 and the interfacial magnetic layer 6 that is magnetically coupled with the ferromagnetic layer 8 are disposed to improve the spin polarization.

If the MTJ element 1A has a multilayer structure in which, for example, a ferromagnetic layer 2 of MnGa, an intermediate layer 5 of amorphous MnGa, an interfacial magnetic layer 3 of CoFe(B), a nonmagnetic layer 4 of crystalline MgO, an interfacial magnetic layer 6 of CoFe(B), and a ferromagnetic layer 8 of MnGa are stacked in this order, the orientation relationship MnGa(001)/CoFe(B)(001)/MgO (001)/CoFe(B)(001)/amorphous intermediate layer/MnGa (001) may be obtained. CoFe(B) means that the ferromagnetic layer may contain B besides Co and Fe. MnGa(001) and MgO(001) mean that crystal is oriented so that the (001) surface is exposed on the top surface. This improves the wave number selection of tunneling electrons, and thus leads to a greater MR ratio.

As described above, according to the second embodiment, a high MR ratio magnetoresistive element including magnetic layers with low saturation magnetization, low Gilbert damping factor, and high perpendicular magnetic anisotropy may be obtained.

Although the ferromagnetic layer 2 is the storage layer, the ferromagnetic layer 8 is the reference layer, the interfacial magnetic layer 3 is disposed on the storage layer side, and the interfacial magnetic layer 6 is disposed on the reference layer side in the second embodiment, the roles of the layers are not limited to this case. Therefore, the ferromagnetic layer 2 may be the reference layer, the ferromagnetic layer 8 may be the storage layer, the interfacial magnetic layer 3 may be disposed on the reference layer side, and the interfacial layer 6 may be disposed on the storage layer side.

(Third Embodiment)

Figure 5:
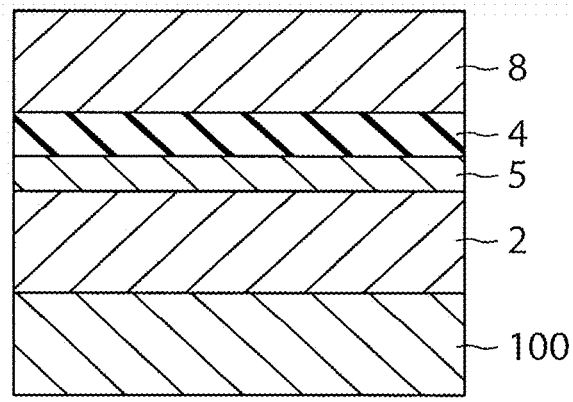
FIG. 5 is a cross-sectional view illustrating a magnetoresistive element according to a third embodiment.

FIG. 5 shows a magnetoresistive element according to a third embodiment. The magnetoresistive element 1B according to the third embodiment is an MTJ element obtained by stacking a ferromagnetic layer 2, an intermediate layer 5, a nonmagnetic layer 4, and a ferromagnetic layer 8 in this order on a base layer 100. The ferromagnetic layer 2 contains, for example, Mn and at least one element selected from Al, Ge, and Ga. Like the first and the second embodiments, the magnetoresistive element 1B according to the third embodiment may become an in-plane magnetization MTJ element or a perpendicular magnetization MTJ element by controlling the crystal orientation of the ferromagnetic layers. The direction of magnetization of one of the ferromagnetic layer 2 and the ferromagnetic layer 8 is not changed after a write current is caused to flow through the MTJ element 1B, and the direction of magnetization of the other may be changed. In the third embodiment, the ferromagnetic layer 2 is the storage layer, and the ferromagnetic layer 8 is the reference layer, for example. The write current is caused to flow between the ferromagnetic layer 2 and the ferromagnetic layer 8 in a direction perpendicular to the film plane, as in the first embodiment.

The intermediate layer 5 of the third embodiment is preferably an amorphous layer, of which two or more elements are the same as those of the ferromagnetic layer 2. If the intermediate layer 5 and the magnetic layer 2 have two or more common constituent elements, the wettability at the interface between the intermediate layer 5 and the magnetic layer 2 is improved. As a result, the intermediate layer 5 may have good flatness, which leads to good flatness of the nonmagnetic layer 4. The thickness of the intermediate layer 5 is preferably thick enough to have a layer of amorphous material. For example, the preferable thickness is 0.1 nm or more. On the other hand, since the intermediate layer 5 is an amorphous layer and disposed adjacent to the nonmagnetic layer 4 in the third embodiment, if the intermediate layer 5 is too thick, high tunneling electron selectability may not be obtained even if the ferromagnetic layer 2 is formed of a material with a high spin polarization. As a result, the magnetoresistive element 113 may not have a high MR ratio. Therefore, the intermediate layer 5 is preferably satisfactorily thin to use the advantage of the band structure of the ferromagnetic layer 2. In this case, for example, the preferable thickness is 1 nm or less.

The significance of a very thin amorphous intermediate layer 5 will be described below. If the intermediate layer 5 is not disposed, for example, and if the MTJ element has a multilayer structure in which a ferromagnetic layer of MnGa, a nonmagnetic layer of crystalline MgO, and a ferromagnetic layer of MnGa are stacked in this order, the orientation relationship MnGa(001)/MgO(001)/MnGa(001) may be obtained. However, the lattice mismatch obtained from the bulk lattice constants in the in-plane direction of MnGa and MgO is as high as about 8%. The lattice mismatch is defined by the following formula:

(a(MgO)−a(MnGa))/a(MnGa)×100 where a(MgO) and a(MnGa) are lattice constants in the in-plane direction of MgO and MnGa. A great lattice mismatch may cause dislocations at the interface in order to reduce the interfacial energy caused by the lattice strain. If this happens, epitaxial relationships may be established among crystal grains, and thus it is difficult to cause uniform epitaxial growth in the entire film plane. If a current flows through an MTJ element in this state, the MR ratio may be reduced since the dislocation becomes an electron scattering source. Therefore, in order to cause uniform epitaxial growth in the entire film plane without causing dislocations, it is important to stack layers containing materials that do not cause great lattice mismatch.

If the MTJ element includes a very thin amorphous intermediate layer 5, and has a multilayer structure including a ferromagnetic layer 2 of MnGa, a very thin amorphous intermediate layer 5 of amorphous MnGa, a nonmagnetic layer 4 of crystalline MgO, and a ferromagnetic layer 8 of MnGa stacked in this order, an orientation relationship MnGa(001)/MgO(001)/very thin intermediate layer/MnGa (001) may be obtained. MnGa(001) and MgO(001) mean that the crystal is oriented so that the (001) surface is exposed on the top. As described above, the very thin amorphous intermediate layer 5 has very good flatness. Therefore, the MgO layer 4 disposed immediately above the intermediate layer 5 becomes very flat and is self-oriented to have good (001) crystal orientation. Furthermore, the problem of lattice mismatch, which is caused from crystalline layers, disappears, and therefore dislocations are not caused at the interface. The important thing here is that the very thin amorphous intermediate layer 5 needs to be in the amorphous state at the time of the deposition. After the heat treatment that is performed after the deposition, the very thin amorphous intermediate layer 5 may be crystallized.

Thus, according to the third embodiment, a nonmagnetic layer 4 having an ideal interface and good crystallinity may be formed. This improves the wave number selection of tunneling electrons, and leads to a high MR ratio.

As described above, according to the third embodiment, a high MR ratio magnetoresistive element including magnetic layers with low saturation magnetization, low Gilbert damping factor, and high perpendicular magnetic anisotropy may be obtained.

Although the ferromagnetic layer 2 is the storage layer and the ferromagnetic layer 8 is the reference layer in the third embodiment, the roles of the layers are not limited to this case. Therefore, the ferromagnetic layer 2 may be the reference layer, and the ferromagnetic layer 8 may be the storage layer.

(Fourth Embodiment)

Figure 6:
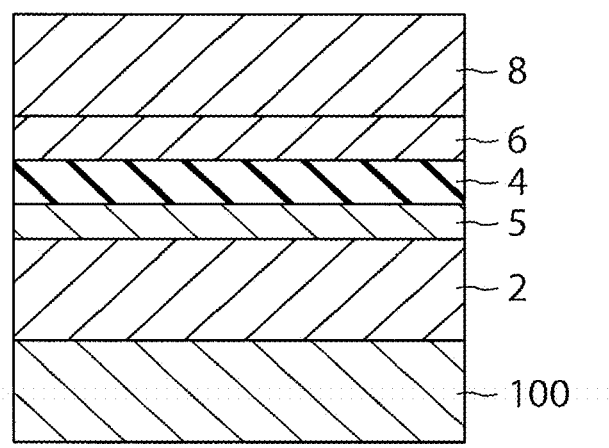
FIG. 6 is a cross-sectional view illustrating a magnetoresistive element according to a fourth embodiment.

FIG. 6 shows a magnetoresistive element according to a fourth embodiment. The magnetoresistive element 1C according to the fourth embodiment is an MTJ element, in which a ferromagnetic layer 2, an intermediate layer 5, a nonmagnetic layer 4, an interfacial magnetic layer 6, and a ferromagnetic layer 8 are stacked in this order on a base layer 100. The ferromagnetic layer 2 is a magnetic layer containing Mn and at least one element selected from Al, Ge, and Ga. The intermediate layer 5 is an amorphous layer of a material, of which two or more elements are the same as those of the material of the ferromagnetic layer 2. The interfacial magnetic layer 6 will be described in detail later. Like the first to third embodiments, the magnetoresistive element 1C according to the fourth embodiment may become an in-plane magnetization MTJ element or a perpendicular magnetization MTJ element by controlling the crystal orientation of the ferromagnetic layers. The direction of magnetization of one of the ferromagnetic layer 2 and the ferromagnetic layer 8 may not be changed after a write current is caused to flow through the MTJ element, and the direction of magnetization of the other may be changed. In the fourth embodiment, the ferromagnetic layer 2 is the storage layer, and the ferromagnetic layer 8 is the reference layer, for example. The write current is caused to flow between the ferromagnetic layer 2 and the ferromagnetic layer 8 in a direction perpendicular to the film plane, as in the first embodiment. The interfacial magnetic layer 6, which is magnetically coupled with the ferromagnetic layer 8, is disposed to increase the spin polarization.

If the MTJ element 1C has a multilayer structure in which, for example, a ferromagnetic layer 2 of MnGa, a very thin intermediate layer 5 of amorphous MnGa, a nonmagnetic layer 4 of crystalline MgO, an interfacial magnetic layer 6 of CoFe(B), and a ferromagnetic layer 8 of MnGa are stacked in this order, the orientation relationship of MnGa (001)/CoFe(B)(001)/MgO(001)/very thin amorphous intermediate layer/MnGa(001) may be obtained. CoFe(B) means that the ferromagnetic layer may contain B besides Co and Fe. MnGa(001) and MgO(001) mean that crystal is oriented to expose the (001) surface on the top. Therefore, for the same reason as the third embodiment, an MgO layer having an ideal interface and good crystallinity may be obtained. This improves the wave number selection of tunneling electrons, and thus a high MR ratio may be obtained.

As described, according to the fourth embodiment, a high MR ratio magnetoresistive element including magnetic layers with low saturation magnetization, low Gilbert damping factor, high perpendicular magnetic anisotropy may be provided.

Although the ferromagnetic layer 2 is the storage layer, the ferromagnetic layer 8 is the reference layer, and the interfacial magnetic layer 6 is disposed on the reference layer side in the fourth embodiment, the roles of the layer are not limited to this case. Therefore, the ferromagnetic layer 2 may be the reference layer, the ferromagnetic layer 8 may be the storage layer, and the interfacial magnetic layer 6 may be disposed on the storage layer side.

(Fifth Embodiment)

Figure 7:
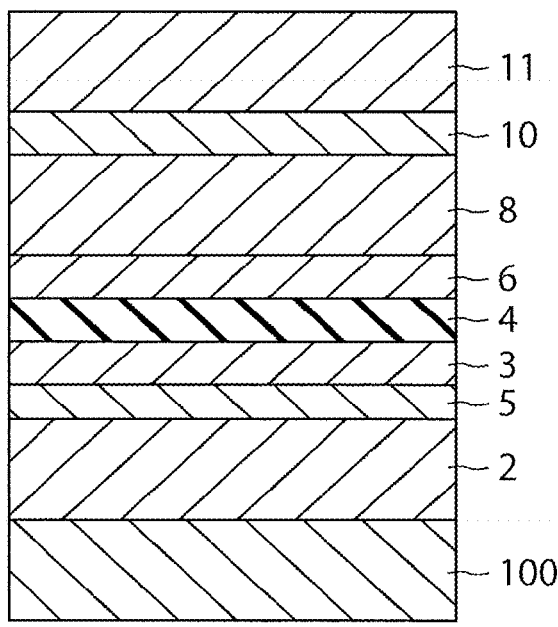
FIG. 7 is a cross-sectional view illustrating a magnetoresistive element according to a fifth embodiment.

FIG. 7 shows a magnetoresistive element according to a fifth embodiment. The magnetoresistive element according to the fifth embodiment is obtained by stacking a nonmagnetic layer 10 and a ferromagnetic layer 11 on the ferromagnetic layer 8 in the magnetoresistive element according to the second embodiment shown in FIG. 4. In the fifth embodiment, the interfacial magnetic layer 6 and the ferromagnetic layer 8 serve as the reference layer, for example. The ferromagnetic layer 11 is also called "bias layer" or "shift adjustment layer," and has a magnetization direction that is antiparallel to (opposite to) that of the ferromagnetic layer 8. The ferromagnetic layer 11 may be antiferromagnetically coupled with the ferromagnetic layer 8 (by synthetic anti-ferromagnetic (SAF) coupling) via the nonmagnetic layer 10. This allows the reduction and adjustment of the shift in critical current for magnetization switching in the storage layer including the interfacial magnetic layer 3 and the ferromagnetic layer 2, caused by a strayed magnetic field from the reference layer including the interfacial magnetic layer 6 and the ferromagnetic layer 8. The nonmagnetic layer 10 preferably has heat resistance by which the ferromagnetic layer 8 and the ferromagnetic layer 11 are not mixed with each other during a heat treatment, and a function to control the crystal orientation of the ferromagnetic layer 11.

If the thickness of the nonmagnetic layer 10 increases, the shift adjustment magnetic field applied from the ferromagnetic layer 11 to the storage layer (in the fifth embodiment, the ferromagnetic layer 2, for example) decreases since the distance between the ferromagnetic layer 11 and the storage layer increases. Therefore, the thickness of the nonmagnetic layer 10 is preferably 5 nm or less. Furthermore, as described above, the ferromagnetic layer 11 may be antiferromagnetically coupled with the ferromagnetic layer 8 via the nonmagnetic layer 10 by the SAF coupling. In this case, however, the magnetic coupling may be broken if the nonmagnetic layer 10 is too thick. Also from this viewpoint, the thickness of the nonmagnetic layer 10 is preferably 5 nm or less. The ferromagnetic layer 11 contains a ferromagnetic material having an easy magnetization axis that is perpendicular to the film plane. Since the ferromagnetic layer 11 is more distant from the storage layer than the reference layer, the thickness or the saturation magnetization Ms of the ferromagnetic layer 11 should be set greater than that of the reference layer in order to adjust the strayed magnetic field applied to the storage layer by means of the ferromagnetic layer 11. According to the study of the inventors, the following relational expression need to be met:

$$Ms_2 \times t_2 < Ms_3 \times t_3$$

where $t_2$ is the thickness of the reference layer, $Ms_2$ is the saturation magnetization of the reference layer, $t_3$ is the thickness of the ferromagnetic layer 11, and $Ms_3$ is the saturation magnetization of the ferromagnetic layer 11.

The ferromagnetic layer 11 of the fifth embodiment may also be applied to the magnetoresistive elements according to the first to fourth embodiments. In this case, the ferromagnetic layer 11 is stacked on the ferromagnetic layer serving as the reference layer, with the nonmagnetic layer 10 being sandwiched therebetween.

(Modifications)

Figure 8:
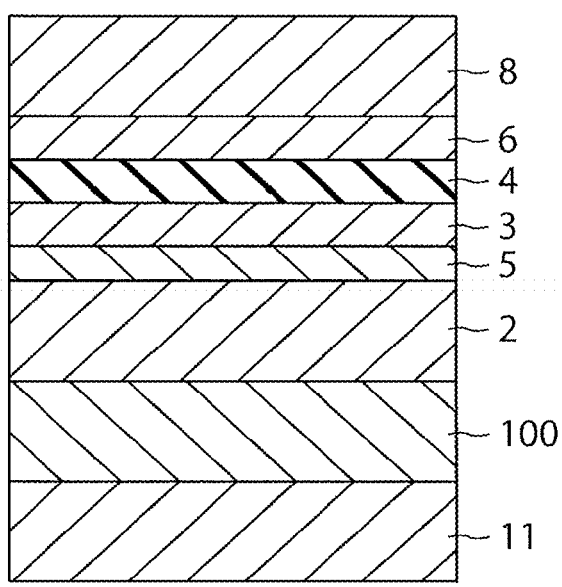
FIG. 8 is a cross-sectional view illustrating a magnetoresistive element according to a first modification of the fifth embodiment.

The fifth embodiment has a top bias structure in which the ferromagnetic layer 2, the intermediate layer 5, the interfacial magnetic layer 3, the nonmagnetic layer 4, the interfacial magnetic layer 6, the ferromagnetic layer 8, the nonmagnetic layer 10, and the ferromagnetic layer 11 are stacked in this order on the base layer 100. However, the ferromagnetic layer 11 may be disposed below the base layer 100. Specifically, a bottom bias structure in which the base layer 100, the ferromagnetic layer 2, the intermediate layer 5, the interfacial magnetic layer 3, the nonmagnetic layer 4, the interfacial magnetic layer 6, and the ferromagnetic layer 8 are stacked in this order on the ferromagnetic layer 11 may be employed, as in a magnetoresistive element 1E according to a first modification of the fifth embodiment shown in FIG. 8. In this case, the ferromagnetic layer 2 is preferably used as the reference layer.

Figure 9:
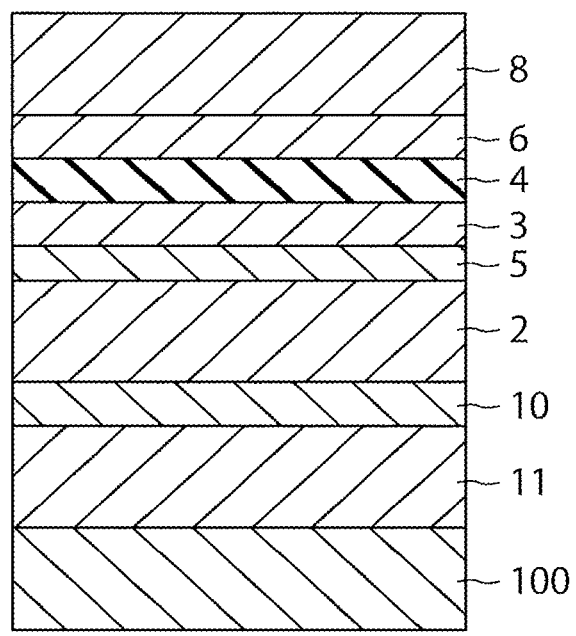
FIG. 9 is a cross-sectional view illustrating a magnetoresistive element according to a second modification of the fifth embodiment.

The stacking order of the ferromagnetic layer 11 and the base layer 100 may be reversed, as in a magnetoresistive element 1F according to a second modification of the fifth embodiment shown in FIG. 9. Specifically, the base layer 100, the ferromagnetic layer 11, the nonmagnetic layer 10, the ferromagnetic layer 2, the intermediate layer 5, the interfacial magnetic layer 3, the nonmagnetic layer 4, the interfacial magnetic layer 6, and the ferromagnetic layer 8 may be stacked in this order.

In both of the above modifications, the amount of strayed magnetic field to be applied to the storage layer by the ferromagnetic layer 11 should be set to be substantially the same as the amount of strayed magnetic field to be applied by the reference layer, as described in the descriptions of the fifth embodiment. Thus, if the distance between the storage layer and the shift adjustment layer is shorter than the distance between the storage layer and the reference layer, the following relational expression should be met:

total amount of magnetization in the shift adjustment layer<total amount of magnetization of the reference layer.

On the other hand, if the distance between the storage layer and the shift adjustment layer is longer than the distance between the storage layer and the reference layer, the following relational expression should be met:

total amount of magnetization of the shift adjustment layer>total amount of magnetization of the reference layer.

According to the fifth embodiment and its modifications, a high MR ratio magnetoresistive element including magnetic layers having low saturation magnetization, low Gilbert damping factor, and high perpendicular magnetic anisotropy may be obtained, like the second embodiment.

(MTJ Element Including Magnetic Film Having Monocrystalline Structure)

A method for manufacturing an MTJ element including a magnetic film having a monocrystalline structure ("monocrystalline MTJ element") will be described. It is preferable that at least one of the ferromagnetic layer 2, the ferromagnetic layer 8, the interfacial magnetic layer 3, and the interfacial magnetic layer 6 of a magnetoresistive element (MTJ element) according to any of the first to fifth embodiments and their modifications has a monocrystalline structure. The reason for this is that the monocrystalline structure in which the crystal orientation in the film plane is in the same direction may enhance the magnetic coupling in the film plane, and thus considerably suppress variations in magnetic characteristics in the magnetic film. Furthermore, the occurrence of grain boundary is suppressed, and therefore a magnetic film or an insulating layer with a smooth surface in the atomic level and a good crystallinity may be formed. Accordingly, the MR ratio of the MTJ element may become greater than that of conventional MTJ elements. Such monocrystalline MTJ elements are needed to manufacture large-capacity MRAMs of several Gbits.

However, it is not possible to grow a monocrystalline film on a substrate on which a circuit is formed since wiring lines of such a circuit generally have polycrystalline or amorphous structures. Therefore, it is difficult to form monocrystalline MTJ elements on a substrate with transistors.

An MRAM with monocrystalline MTJ elements, however, may be formed by preparing a monocrystalline substrate on which monocrystalline MTJ elements are formed and a substrate on which transistors are formed, bonding the monocrystalline substrate with the MTJ elements and the substrate with the transistors, and removing the monocrystalline substrate, which is not needed. This method will be described with reference to FIGS. 10A to 11C.

Figure 10A:
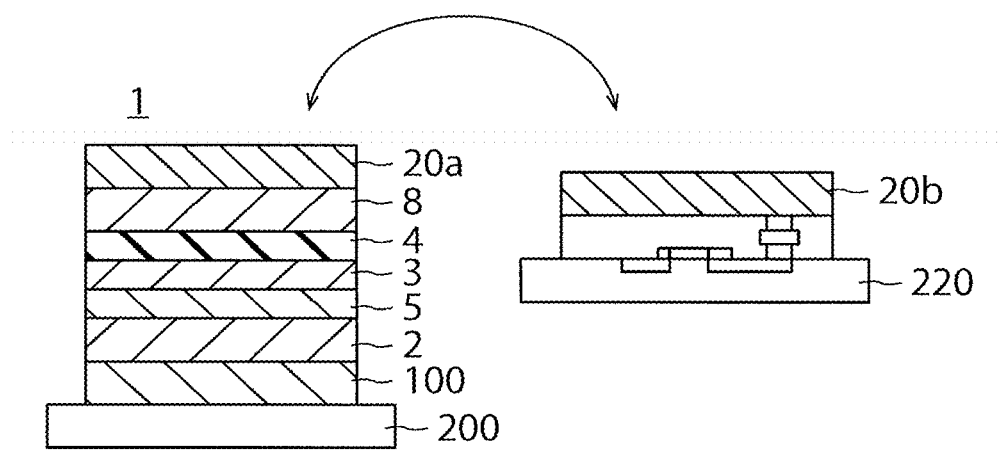
FIGS. 10A and 10B illustrate a method of manufacturing an MTJ element including monocrystalline magnetic films.

First, an MTJ element according to any of the first to fifth embodiments is formed on a silicon (Si) monocrystalline substrate under appropriate conditions. For example, the MTJ element 1 according to the first embodiment is formed. A base layer 100, a ferromagnetic layer 2, an intermediate layer 5, an interfacial magnetic layer 3, a nonmagnetic layer 4, and a ferromagnetic layer 8 are disposed on the Si monocrystalline substrate 200 in this order by a sputtering method or a molecular beam epitaxy (MBE) method, as shown in FIG. 10A, to obtain the MTJ element 1 shown in FIG. 3. The crystallinity of the Si monocrystalline substrate 200 is conveyed to the base layer 100 and the ferromagnetic layer 2 to make the MTJ element 1 a monocrystalline MTJ element including at least one monocrystalline layer. Thereafter, a metal adhesion layer 20a is formed on the ferromagnetic layer 8 (FIG. 10A). Similarly, a substrate 220 is prepared, on which a transistor circuit and wiring lines are formed, and a metal adhesion layer 20b is formed on the substrate 220 (FIG. 10A). The metal adhesion layers 20a and 20b are formed of a metal such as Al, Au, Cu, Ti, and Ta.

Figure 10B:
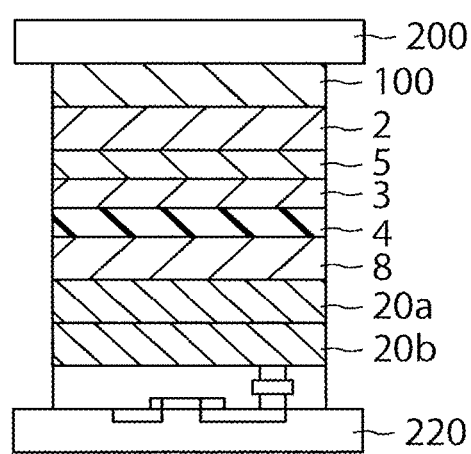

The substrate 200, on which the monocrystalline MTJ element 1 is formed, and the substrate 220, on which the transistor circuit is formed, are arranged so that the metal adhesion layers 20a and 20b face each other. Subsequently, the metal adhesion layers 20a and 20b are brought into contact with each other as shown in FIG. 10B. The metal adhesion layers 20a and 20b are bonded together by applying a pressure to them. The layers may be heated while being pressed, in order to improve the bonding force.

Figure 11A:
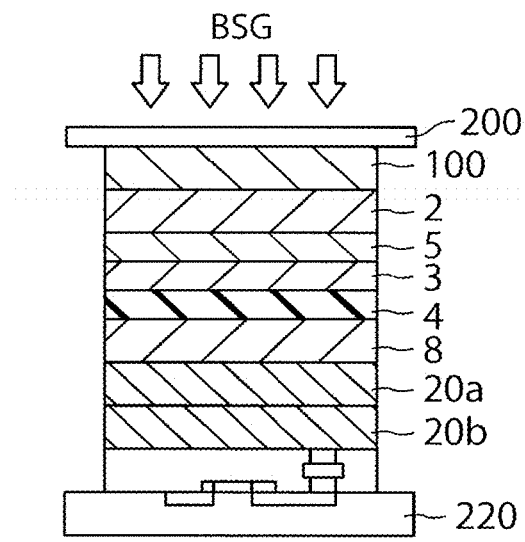
FIGS. 11A to 11C illustrate the method of manufacturing an MTJ element including monocrystalline magnetic films.
Figure 11B:
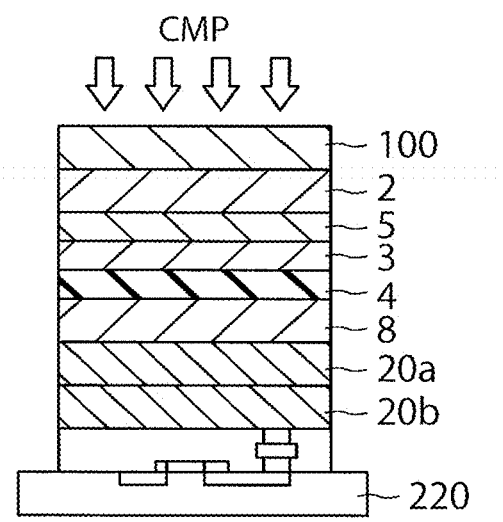
Figure 11C:
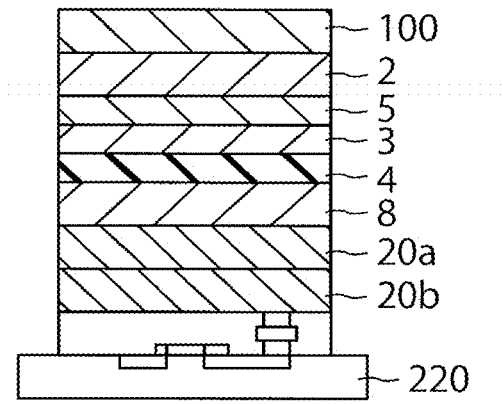

Thereafter, the monocrystalline substrate 200, on which the monocrystalline MTJ element 1 is formed, is removed as shown in FIG. 11A. The removal is performed by first thinning the monocrystalline substrate 200 by a backside grinder (BSG) method, for example, and then mechanically polishing the thinned monocrystalline substrate 200 by chemical mechanical polishing (CMP), for example, as shown in FIG. 11B. As a result, the MTJ element is obtained (FIG. 11C).

As described above, the monocrystalline MTJ element according to any of the first to fifth embodiments, formed on a substrate with a circuit, can be produced by preparing the monocrystalline substrate 200, on which the monocrystalline MTJ element according to any of the first to fifth embodiments is formed, and the substrate 220, on which a transistor circuit is formed, bonding the substrate with the transistor circuit on the monocrystalline MTJ element, and removing the monocrystalline substrate 200 that is not needed.

Next, the specific structure of each of the layers included in the MTJ element according to any of the first to fifth embodiments and their modifications will be described in the order of the ferromagnetic layer 2, the intermediate layer 5, the ferromagnetic layer 8, the base layer 100, the nonmagnetic layer 4, the interfacial magnetic layer 3, and the interfacial magnetic layer 6. In the following descriptions, the ferromagnetic layer 2 is the storage layer, the ferromagnetic layer 8 is the reference layer, the interfacial magnetic layer 3 is disposed on the storage layer side, and the interfacial magnetic layer 6 is disposed on the reference layer side. It is not necessary, however, that the storage layer is disposed to the lower portion of the multilayer structure. Therefore, the ferromagnetic layer 2 may be the reference layer, the ferromagnetic layer 8 may be the storage layer, the interfacial magnetic layer 3 may be disposed on the reference layer side, and the interfacial magnetic layer 6 may be disposed on the storage layer side.

(Ferromagnetic Layer 2)

The ferromagnetic layer 2 is preferably formed of a magnetic material having the perpendicular magnetization, having low saturation magnetization Ms and high magnetic anisotropy energy Ku for maintaining the thermal stability factor $\Delta$ to perform magnetization switching with a high thermal stability and a low electric current, and having a coercive field, anisotropy magnetic field, or Gilbert damping factor lower than that of the magnetic material of the ferromagnetic layer 8. Furthermore, the magnetic material of the ferromagnetic layer 2 preferably has high polarizability.

The ferromagnetic layer 2 will be specifically described below.

A first specific example of the ferromagnetic layer 2 is a magnetic layer containing Mn and at least one element selected from the group consisting of Al, Ge, and Ga. Specific examples of the magnetic material of the ferromagnetic layer 2 include MnGa, MnAl, MnGe, and MnAlGe. As used herein, a phrase referring to "at least one of" a list of items refers to any combination of those items, including a single member. As an example, "at least one of: a, b, or c" is intended to cover a, b, c, a-b, a-c, b-c, and a-b-c."

A second specific example is a magnetic layer containing Mn, Ga, and at least one element selected from the group consisting of Al, Ge, Ir, Cr, Co, Pt, Ru, Pd, Rh, Ni, Fe, Re, Au, Cu, B, C, P, Gd, Tb, and Dy. Specific examples include MnGaAl, MnGaGe, MnGaIr, MnGaCr, MnGaCo, MnGaPt, MnGaRu, MnGaPd, MnGaRh, MnGaNi, MnGaFe, MnGaRe, MnGaAu, MnGaCu, MnGaB, MnGaC, MnGaP, MnGaGd, MnGaTb, and MnGaDy.

In order to provide the perpendicular magnetic anisotropy to the aforementioned materials, the c-axis needs to be grown along a direction perpendicular to the film plane, i.e., (001) orientation growth needs to be performed. Specifically, it is possible to control the crystal orientation growth of the ferromagnetic layer 2 by appropriately selecting the material of the base layer 100. The details of the base layer 100 will be described later.

A third specific example is a magnetic film of an alloy containing at least one element selected from the group consisting of Fe, Co, and Ni, and at least one element selected from the group consisting of Ru, Rh, Pd, Ag, Ir, Pt, and Au, or a laminated structure of these materials. Specific examples of the laminated structure include Co/Pt artificial superlattice, Co/Pd artificial superlattice, Co/Ru artificial superlattice, and Co/Au artificial superlattice. The perpendicular magnetic anisotropy and the saturation magnetization of these artificial superlattices may be adjusted by adding further elements to the ferromagnetic layer, or adjusting the ratio in thickness between the ferromagnetic layer and the nonmagnetic layer. Specific examples of the alloy include ferromagnetic alloys such as FeRh, FePt, FePd, and CoPt.

In order to switch the magnetization with a low electric current, the thickness of the ferromagnetic layer 2 needs to be reduced as much as possible. A preferable thickness in this viewpoint is in a range of 1 to 5 nm. However, crystalline materials capable of obtaining a high thermal stability factor by the crystalline magnetic anisotropy may have a problem of degraded anisotropy if the film thickness of these materials is reduced. From this viewpoint, the film thickness is preferably equal to or more than the critical thickness of the crystal, and 10 nm or less.

(Intermediate Layer 5)

The intermediate layer 5 is preferably an amorphous layer of a material, of which two or more elements are the same as those included in the material of the magnetic layer 2. The method of producing the intermediate layer 5 will be described later. The "amorphous" herein means that the layer does not have a long range order (periodic structure) like crystal. However, the amorphous layer may have a short range order. Embodiments may also include a polycrystalline layer including crystal grains having an average diameter of 2 nm or less since it is often difficult to determine whether a layer has a crystalline structure or an amorphous structure. Due to this, the crystallinity of the intermediate layer 5 may be lower than that of the magnetic layer 2 in embodiments. The indicator of the crystallinity may be, for example, regularity if the layer contains ordered intermetallic compounds. The method of analyzing crystal will be described later.

The appropriate thickness of the intermediate layer 5 is determined by the multilayer structure of the magnetoresistive element. For example, if the multilayer structure includes a nonmagnetic layer 4, an interfacial magnetic layer 3, an intermediate layer 5, and a ferromagnetic layer 2 like the first and second embodiments, the intermediate layer 5 is preferably thick enough to become an amorphous layer, and satisfactorily thin not to break the magnetic coupling between the ferromagnetic layer 2 and the interfacial magnetic layer 3. From this viewpoint, the thickness of the intermediate layer 5 is preferably in a range of 0.1 nm to 5 nm.

If the multilayer structure includes a nonmagnetic layer 4, an intermediate layer 5, and a ferromagnetic layer 2 like the third and fourth embodiments, the intermediate layer 5 is preferably thick enough to become an amorphous layer, and satisfactorily thin to reflect the band structure of the ferromagnetic layer 2. From this viewpoint, the thickness of the intermediate layer 5 is preferably in a range of 0.1 nm to 1 nm. If two or more elements are common to the intermediate layer 5 and the ferromagnetic layer 2, the wettability at the interface between the intermediate layer 5 and the ferromagnetic layer 2 improves, and therefore the flatness of the intermediate layer 5 may also improve. This leads to the improvement in flatness of the interfacial magnetic layer 3 disposed immediately above the intermediate layer 5 and the nonmagnetic layer (tunnel barrier layer) 4 disposed above the intermediate layer 5. As a result, the interface between the intermediate layer 5 or the interfacial magnetic layer 3 and the tunnel barrier layer 4, and the interface between the tunnel barrier layer 4 and the magnetic layer disposed immediately above the tunnel barrier layer 4 may be ideally formed without irregularity, and therefore a high MR ratio may be obtained.

The significance of the amorphous intermediate layer 5 differs depending on the type of multilayer structure of the magnetoresistive element. For example, if the multilayer structure includes a nonmagnetic layer 4, an interfacial magnetic layer 3, an intermediate layer 5, and a ferromagnetic layer 2 like the first and second embodiments, and if the intermediate layer 5 is an amorphous layer, the interfacial magnetic layer 3 grows as an amorphous layer without being subjected to the influence of the crystal orientation of the crystalline magnetic layer 2. Since the nonmagnetic layer 4 has a strong self-orientation, it may have a good crystallinity on the amorphous interfacial magnetic layer 3. Annealing performed thereafter crystallizes the interfacial magnetic layer 3 using the crystalline nonmagnetic layer 4 as a template, with the epitaxial relationship between the nonmagnetic layer 4 and the interfacial magnetic layer 3 being maintained.

If the intermediate layer 5 is not an amorphous layer, the interfacial magnetic layer 3 may be subjected to the influence of the crystal orientation of the crystalline magnetic layer 2 and the intermediate layer 5 when it is deposited or annealed. Therefore, the intermediate layer 5 may not have preferable crystal orientation. This may affect the nonmagnetic layer 4 that grows under the influence of the intermediate layer 5. Therefore, the nonmagnetic layer 4 may partially include undesirable crystal orientation with respect to tunneling electron selection.

For the above reasons, the intermediate layer 5 is preferably an amorphous layer in the multilayer structure like that of the first and second embodiments.

If the multilayer structure includes a nonmagnetic layer 4, an intermediate layer 5, and a ferromagnetic layer 2 like the third and fourth embodiments, the nonmagnetic layer 4 grows to be very flat, and self-oriented to have a good crystal orientation since the very thin amorphous intermediate layer 5 is very flat as described above. Furthermore, the problem of lattice mismatch, which is caused in crystal layers, disappears, and therefore dislocations are not caused at the interface. The important thing is that the very thin amorphous intermediate layer 5 needs to be in the amorphous state at the time of the deposition. After the heat treatment that is performed after the deposition, the very thin amorphous intermediate layer 5 may be crystallized.

As described above, the nonmagnetic layer 4 may have an ideal interface and good crystallinity, and the interfacial magnetic layer may have good crystallinity if the intermediate layer 5 is an amorphous layer of a material of which two or more elements are the same as those of the material of the ferromagnetic layer 2. This improves the wave number selection of the tunneling electrons, and leads to a high MR ratio. Thus, a high MR ratio magnetoresistive element including magnetic layers with low saturation magnetization, low Gilbert damping factor, and high perpendicular magnetic anisotropy may be provided.

The material of the intermediate layer 5 will be specifically described below. Basically, two or more elements are common to the intermediate layer 5 and the ferromagnetic layer 2. As described above, the ferromagnetic layer 2 and the interfacial magnetic layer 3 are preferably magnetically coupled with each other via the intermediate layer 5. The intermediate layer 5 may be either a magnetic layer or a nonmagnetic layer. Alloys listed below as specific examples may form a magnetic layer or nonmagnetic layer by modifying the composition ratio. If a stronger magnetic coupling is sought, a nonmagnetic layer is more preferable.

A first specific example of the material to form the intermediate layer 5 is an alloy containing Mn and at least one element selected from Al, Ge, and Ga. Specific examples include MnGa, MnAl, MnGe, and MnAlGe.

A second specific example is an alloy containing Mn, Ga, and at least one element selected from Al, Ge, Ir, Cr, Co, Pt, Ru, Pd, Rh, Ni, Fe, Re, Au, Cu, B, C, P, Gd, Tb, and Dy. Specific examples include MnGaAl, MnGaGe, MnGaIr, MnGaCr, MnGaCo, MnGaPt, MnGaRu, MnGaPd, MnGaRh, MnGaNi, MnGaFe, MnGaRe, MnGaAu, MnGaCu, MnGaB, MnGaC, MnGaP, MnGaGd, MnGaTb, and MnGaDy.

A third specific example is an alloy or laminated structure containing at least one element selected from Fe, Co, and Ni, and at least one element selected from Ru, Rh, Pd, Ag, Ir, Pt, and Au. Specific examples of laminated structure include Co/Pt artificial superlattice, Co/Pd artificial superlattice, Co/Ru artificial superlattice, and Co/Au artificial superlattice. Specific examples of alloy include FeRh, FePt, FePd, and CoPt.

(Crystal Analysis Method)

The intermediate layer 5 preferably has an amorphous structure. An example of a method of analyzing the amorphous structure will be described below. Whether the intermediate layer 5 has an amorphous structure may be determined by using the method described below.

A first specific example of the analysis method is a structural analysis by means of a transmission electron microscope (TEM). TEMs are capable of obtaining information such as crystal pattern, existence of lattice defects, and crystal orientation. If the diffraction pattern of electron beams is also obtained, the organization in the atom level and the crystal structure may also be obtained.

A second specific example of the analysis method is an analysis by means of a high-angle annular dark field scanning TEM (HAADF-STEM). Since electrons emitted to atoms and scattered are detected in this analysis method, a contrast that is proportional to the atom weight may be obtained.

Third specific examples include an X-ray absorption fine structure (XAFS) method, an extended X-ray absorption fine structure (EXAFS) method, and an X-ray absorption near edge structure (XANES). Chemical state analysis and structural analysis may be performed by employing these analysis methods. If the detection method is changed to an analysis depth (surface or bulk), a nondestructive chemical state analysis in a depth direction may be performed.

(Manufacturing Method)

The intermediate layer 5 preferably has an amorphous structure and is superior in flatness. A method of manufacturing such an intermediate layer 5 will be described below. A preferable intermediate layer 5 may be formed on the ferromagnetic layer 2 by using the following method.

A first specific example of the manufacturing method uses a sputtering method or a molecular beam epitaxy (MBE) method. Since the intermediate layer 5 is preferably very thin, 0.1 nm to 5 nm in thickness, and flat, the deposition rate is important. For example, the deposition rate during the sputtering method is preferably adjusted to be 0.4 Å/sec or less by controlling the power and/or the gas pressure during the deposition. The intermediate layer 5 also preferably has an amorphous structure. Since the ferromagnetic layer 2 includes at least two elements common to the intermediate layer 5 and the ferromagnetic layer 2 is crystalline and disposed underneath the intermediate layer 5, the intermediate layer 5 does not have an amorphous structure unless it is formed with as a low energy as possible. Therefore, the deposition is preferably performed at room temperature rather than during a heating operation.

For example, if the ferromagnetic layer 2 is formed of MnGa, the intermediate layer 5 is preferably formed of amorphous MnGa. A method of forming an amorphous MnGa layer will be described below. In addition to the low-energy deposition described above, the composition of MnGa has a great influence on the crystallization of MnGa. According to the inventors, crystallization occurs more easily with Mn-rich and Ga-poor compositions. Therefore, Mn-poor and Ga-rich compositions are more suitable to obtain MnGa amorphous layers. From the viewpoint of thermal stability of amorphous layers, Mn-poor and Ga-rich compositions are more preferable. However, the composition range is not limited by the above descriptions, and amorphous layers may be formed with other composition ranges by controlling the deposition conditions, as described above.

If the ferromagnetic layer 2 is formed of FePd, the intermediate layer 5 is preferably an amorphous layer containing Fe and Pd. A method of forming a FePd amorphous layer will be described below. FePd is easy to crystallize. Therefore, it is difficult to obtain an amorphous FePd layer with the aforementioned low-energy deposition method. A certain amount or more of light element added to such an easy-to-crystallize material may be effective. Specific examples of such a light element are B, C, and P. Therefore, for example, FePdB, FePdC, and FePdP may be suitable materials to form the amorphous layer. The content of the light element is preferably about 20% or more. As described above, an amorphous intermediate layer may be more effectively obtained by adding a light element to FePd. Co/Pt artificial superlattice, Co/Pd artificial superlattice, Co/Ru artificial superlattice, and Co/Au artificial superlattice, and FeRh, FePt, CoPt, and CoPd, for example, bring about the same effect as FePd.

A second specific example of the manufacturing method is etching of the ferromagnetic layer 2. Since two or more constituent elements are common to the intermediate layer 5 and the ferromagnetic layer 2, the intermediate layer 5 may be obtained by etching the ferromagnetic layer 2. An intermediate layer 5 having an amorphous structure may be obtained by breaking the crystal structure of the ferromagnetic layer 2 by causing damages by the etching. The thickness of the intermediate layer 5 may be controlled by adjusting the acceleration voltage during the etching. The composition ratio of the intermediate layer 5 thus obtained may be different from that of the ferromagnetic layer 2 due to the influence of the selective etching. Specifically, sputtering rate is subjected to the influence of selective etching, for example. If a ferromagnetic layer 2 is formed of an alloy AB including an element A with a larger sputtering rate and an element B with a smaller sputtering rate, the composition ratio of the intermediate layer 5 may be shifted from the composition ratio of the ferromagnetic layer 2 due to the influence of selective etching, so that the content of the element A moves to relatively smaller, and the content of the element B moves to relatively larger. More specifically, if the ferromagnetic layer 2 is formed of MnGa, the intermediate layer 5 formed by etching has a Mn-poor and Ga-rich composition, $Mn_{1-x}Ga_{1+x}$ (x>0), since the sputtering rate of Mn is larger than that of Ga. It should be noted that the sputtering rate is not determined by the constituent elements, but changes due to the acceleration voltage and the type of atmosphere gas used during the etching.

Figure 12:
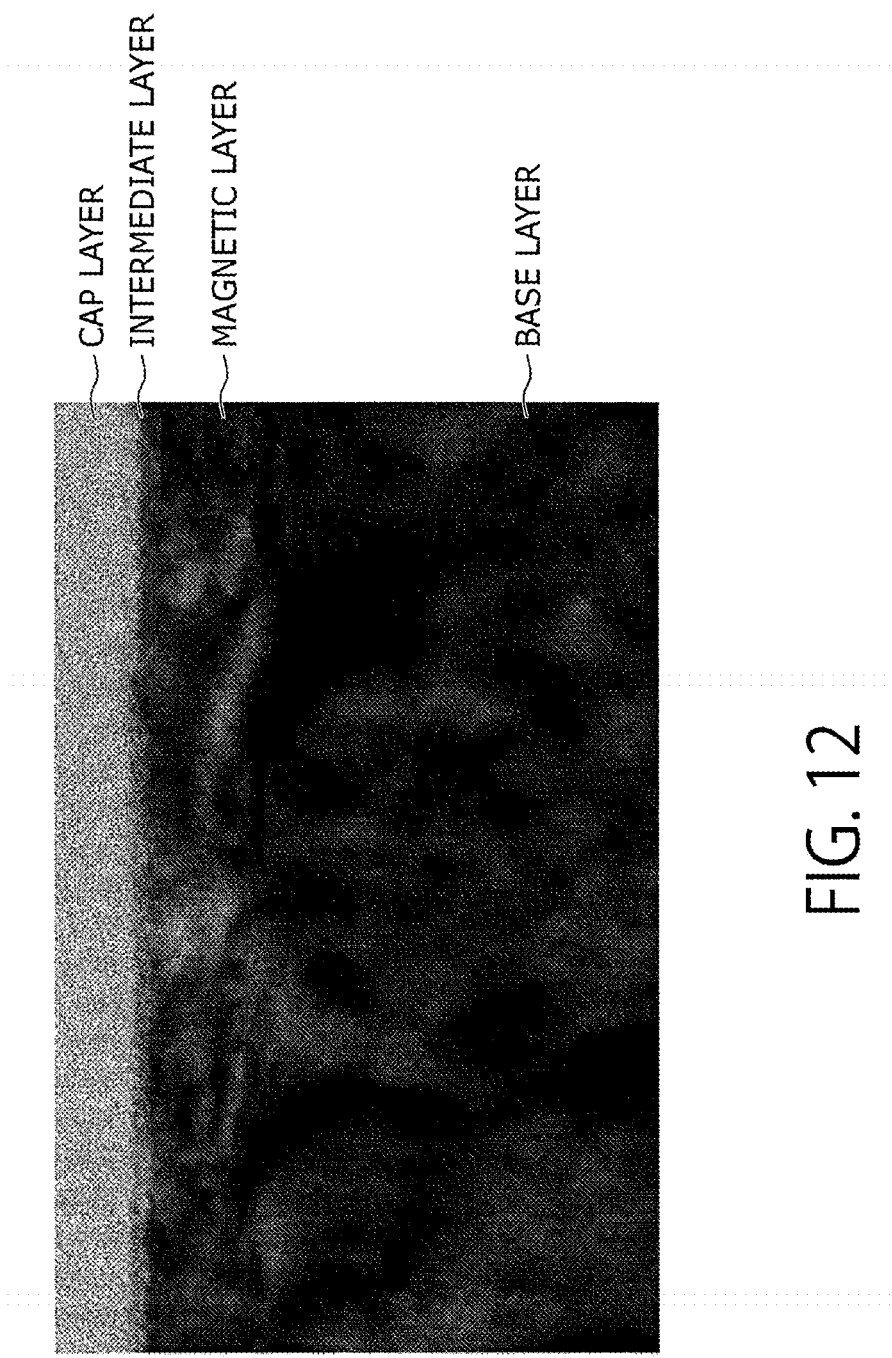
FIG. 12 is a photograph showing a TEM image of a section of a multilayer structure including an intermediate layer, a magnetic layer, and a base layer.

FIG. 12 shows an example of a TEM image of a section of a multilayer structure, intermediate layer/magnetic layer/base layer, obtained by the aforementioned method. The thickness of the intermediate layer is about 1 nm. As is clear from FIG. 12, the base layer and the magnetic layer have a crystalline structure but the intermediate layer has an amorphous structure and is very flat.

(Ferromagnetic Layer 8)

The ferromagnetic layer 8 is preferably formed of a magnetic material having an easy magnetization axis that is perpendicular to the film plane, having high magnetic anisotropy energy Ku to maintain the thermal stability factor Δ, and having a coercive field, anisotropy magnetic field, or Gilbert damping factor higher than that of the ferromagnetic layer 2. In order to reduce the influence of the strayed magnetic field from the reference layer, the magnetic material preferably has low saturation magnetization Ms and high polarizability. The ferromagnetic layer 8 will be specifically described below.

A first specific example of the ferromagnetic layer 8 is a magnetic layer containing Mn and at least one element selected from the group consisting of Al, Ge, and Ga. Specific examples of the magnetic material of the ferromagnetic layer 8 include MnGa, MnAl, MnGe, and MnAlGe.

A second specific example is a magnetic layer containing Mn, Ga, and at least one element selectee from the group consisting of Al, Ge, Ir, Cr, Co, Pt, Ru, Pd, Rh, Ni, Fe, Re, Au, Cu, B, C, P, Gd, Tb, and Dy. Specific examples include MnGaAl, MnGaGe, MnGaIr, MnGaCr, MnGaCo, MnGaPt, MnGaRu, MnGaPd, MnGaRh, MnGaNi, MnGaFe, MnGaRe, MnGaAu, MnGaCu, MnGaB, MnGaC, MnGaP, MnGaGd, MnGaTb, and MnGaDy.

In order to provide the perpendicular magnetic anisotropy to the aforementioned materials, the c-axis needs be grown along a direction perpendicular to the film plane, i.e., (001) orientation growth should be performed. Specifically, it is possible to control the crystal orientation growth of the ferromagnetic layer 8 by appropriately selecting the materials of the nonmagnetic layer 4 and the interfacial magnetic layer 6. The details of the nonmagnetic layer 4 and the interfacial magnetic layer 6 will be described later.

A third specific example is a magnetic layer of an alloy containing a metal that has the (111) crystal orientation of a face-centered cubic (FCC) structure or has the (0001) crystalline orientation of the hexagonal close-packed (HCP) structure, or a metal that may form an artificial superlattice. Examples of the metal that has the (111) crystal orientation of a face-centered cubic (FCC) structure or the (0001) crystalline orientation of the hexagonal close-packed (HCP) structure include an alloy containing at least one element selected from the group consisting of Fe, Co, Ni, and Cu, and at least one element selected from the group consisting of Pt, Pd, Rh, and Au. Specific examples include ferromagnetic alloys such as CoPd, CoPt, NiCo, and NiPt.

Examples of the artificial superlattice used in the ferromagnetic layer 8 has a structure alternately including layers of an alloy (ferromagnetic films) containing at least one element selected from the group consisting of Fe, Co, and Ni, and layers of an alloy (nonmagnetic films) containing at least one element selected from the group consisting of Cr, Pt, Pd, Ir, Rh, Ru, Os, Re, Au, and Cu. Specific examples include Co/Pt artificial superlattice, Co/Pd artificial superlattice, CoCr/Pt artificial superlattice, Co/Ru artificial superlattice, Co/Os artificial superlattice, Co/Au artificial superlattice, and Ni/Cu artificial superlattice. The perpendicular magnetic anisotropy and the saturation magnetization of these artificial superlattices may be adjusted by adding further elements to the ferromagnetic films, or adjusting the ratio in thickness between the ferromagnetic film and the nonmagnetic film.

A fourth specific example is a magnetic layer of an alloy containing at least one element selected from the group consisting of transition metals Fe, Co, and Ni, and at least one element selected from the group consisting of rare earth metals Tb, Dy, and Gd. Specific examples include TbFe, TbCo, TbFeCo, DyTbFeCo, and GdTbCo. A multilayer structure obtained by alternately stacking layers of these alloys may also be employed. Specific examples of the multilayer structure include TbFe/Co, TbCo/Fe, TbFeCo/CoFe, DyFe/Co, DyCo/Fe, and DyFeCo/CoFe. The perpendicular magnetic anisotropy and the saturation magnetization of these alloys may be adjusted by adjusting the thickness ratios and the compositions.

A fifth specific example is a magnetic layer of an alloy containing at least one element selected from the group consisting of Fe, Co, Ni, and Cu, and at least one element selected from the group consisting of Pt, Pd, Rh, and Au. Specific examples include ferromagnetic alloys such as FeRh, FePt, FePd, and CoPt.

(Base Layer 100)

The base layer 100 is used to control the crystallinity such as the crystal orientation and the crystal grain size of the ferromagnetic layer 2 and the layers above the ferromagnetic layer 2. Therefore, the selection of the material of the base layer 100 is important. The material and the structure of the base layer 100 will be described below. Although both conductive and insulating materials may be used to form the base layer, a conductive material is more preferable if electric current needs to flow through the base layer.

A first specific example of the base layer 100 is a nitride layer having a (001) oriented NaCl structure, and containing at least one element selected from the group consisting of Ti, Zr, Nb, V, Hf, Ta, Mo, W, B, Al, and Ce.

A second specific example of the base layer 100 is a layer of (002) oriented perovskite oxide containing $ABO_3$, where the A-site is occupied by at least one element selected from the group consisting of Sr, Ce, Dy, La, K, Ca, Na, Pb, and Ba, and the B-site is occupied by at least one element selected from the group consisting of Ti, V, Cr, Mn, Fe, Co, Ni, Ga, Nb, Mo, Ru, Ir, Ta, Ce, and Pb.

A third specific example of the base layer 100 is a layer of oxide having a (001) oriented NaCl structure, and containing at least one element selected from the group consisting of Mg, Al, and Ce.

A fourth specific example of the base layer 100 is a layer having a (001) oriented tetragonal structure or cubic structure, and containing at least one element selected from the group consisting of Al, Cr, Fe, Co, Ni, Rh, Pd, Ag, Ir, Pt, Au, Mo, and W.

A fifth specific example of the base layer 100 has a multilayer structure in which two or more layers of the first to fourth specific examples are stacked. By appropriately selecting the structure of the base layer, the crystallinity of the ferromagnetic layer 2 and the layers above the ferromagnetic layer 2 may be controlled to improve the magnetic characteristics.

(Nonmagnetic Layer 4)

The nonmagnetic layer 4 may be of conductive or insulating material, but is preferably a tunnel barrier layer of an insulating material. The nonmagnetic layer 4 may establish a selective tunnel transport and a high MR ratio if appropriately combined with adjacent layers such as ferromagnetic layer and interfacial magnetic layer. Therefore, the selection of the material of the nonmagnetic layer 4 is important. The material of the nonmagnetic layer 4 will be described below.

A first specific example of the material of the tunnel barrier layer 4 is an oxide containing at least one element selected from the group consisting of Mg, Ca, Ba, Al, Be, Sr, Zn, Ti, V, and Nb. Specific examples include MgO, AlO, ZnO, SrO, BaO, and TiO. The crystal structure of the oxide is preferably the NaCl structure. Specific examples of such a material include MgO, CaO, SrO, BaO, TiO, VO, and NbO. The oxide having the NaCl structure may be easily grown with the (001) surface being preferred orientation surface on the (001) surface of a layer of Fe, Co, or Ni, a layer of alloy containing two or more of Fe, Co, and Ni as main constituent elements, a layer of a metal having a body-centered cubic structure with preferred orientation of (001), a layer of alloy containing two or more of metals having a body-centered cubic structure with preferred orientation of (001) as main constituent elements, or a layer of alloy containing Mn and at least one element selected from the group consisting of Al, Ge, and Ga. In particular, it is possible to achieve preferred orientation of (001) surface if crystal is grown on a CoFe—X amorphous alloy (where X indicates an added element such as B, C, and N), to which a very small amount of at least one element selected from the group consisting of B, C, N, Ti, Ta, P, Mo, Si, W, and Nb is added to improve the amorphous property.

The tunnel barrier layer 4 may be of a mixed crystal containing two or more materials selected from the aforementioned oxides, or have a multilayer structure including layers of such oxides. Examples of the mixed crystal include MgAlO, MgZnO, MgTiO, and MgCaO. Examples of two-layer multilayer structure include MgO/ZnO, MgO/AlO, TiO/AlO, and MgAlO/MgO. Examples of three-layer multilayer structure include AlO/MgO/AlO, ZnO/MgO/ZnO, and MgAlO/MgO/MgAlO.

A second specific example of the material of the tunnel barrier layer 4 is a (002) oriented perovskite oxide of $ABO_3$, where the A-site is occupied by at least one element selected from the group consisting of Sr, Ce, Dy, La, K, Ca, Na, Pb, and Ba, and the B-site is occupied by at least one element selected from the group consisting of Ti, V, Cr, Mn, Fe, Co, Ni, Ga, Nb, Mo, Ru, Ir, Ta, Ce, and Pb. Specific examples include $SrTiO_3$, $SrRuO_3$, $SrNbO_3$, $BaTiO_3$, and $PbTiO_3$. The lattice constant of the [100] plane of each of these oxides is about 3.7 Å-4.0 Å, which is close to the lattice constant of about 3.9 Å of the [100] plane of a MnGa alloy, for example. Thus, these oxides are suitable to form an interface with good quality in order to obtain a high MR ratio.

A third specific example of the material of the tunnel barrier layer 4 is a spinel oxide of MgAlO. The lattice constant of $MgAl_2O_4$ having the spinel structure is about 4.05 Å. Therefore, the lattice mismatch of $MgAl_2O_4$ with respect to the lattice constant of the [100] plane of a MnGa alloy, about 3.9 Å, is relatively small. Accordingly, this material is suitable to form an interface with good quality in order to obtain a high MR ratio.

The tunnel barrier layer may be formed of either crystalline or amorphous material. If the tunnel barrier layer is formed of a crystalline material, the electron scattering within the tunnel barrier layer may be suppressed. This may improve the possibility that electrons may be subjected to selective tunnel transport from the ferromagnetic layer with the wave number being maintained. This leads to improvement in the MR ratio. Therefore, in order to obtain a greater MR ratio, a tunnel barrier layer of a crystalline material is more preferable.

(Interfacial Magnetic Layer 3)

The interfacial magnetic layer 3 is a perpendicular magnetization film. In order to meet the requirements of a high thermal stability and a low-current magnetization switching, the interfacial magnetic layer 3 is preferably formed of a material with a high magnetic anisotropy energy Ku to maintain the thermal stability factor A, a high spin polarization, and a low Gilbert damping factor. Examples of materials meeting such requirements will be specifically described below.

A specific example of the material of the interfacial magnetic layer 3 is an alloy containing a metal selected from Fe and Co. If an interfacial magnetic layer of CoFe, a nonmagnetic layer of MgO, and an interfacial magnetic layer of CoFe are stacked, the orientation relationship of CoFe(001)/MgO(001)/CoFe(001) may be obtained. This improves the wave number selection of tunneling electrons. As a result, a high MR ratio may be obtained. In order to control the saturation magnetization of the interfacial magnetic layer 3, at least one element selected from the group consisting of Ni, B, C, P, Ta, Ti, Mo, Si, W, Nb, Mn, and Ge may be added to the interfacial magnetic layer 3. Thus, the interfacial magnetic layer 3 may be formed of an alloy containing at least one element selected from the group consisting of Fe and Co, and at least one element selected from the group consisting of Ni, B, C, P, Ta, Ti, Mo, Si, W, Nb, Mn, and Ge. Examples of such an alloy include CoFeSi, CoFeP, CoFeW, and CoFeNb besides CoFeB. These alloys have a spin polarization similar to that of CoFeB.

Generally, there is a correlation between the Gilbert damping factor and the magnitude of spin orbit interaction of a material. A material having a higher atomic number has greater spin orbit interaction and a higher Gilbert damping factor. Alloys consisting of at least one of Fe and Co, and at least one of light elements have a smaller Gilbert damping factor than that of alloys consisting of at least one of Fe and Co, and at least one of heavy elements. Accordingly, the energy required for magnetization switching in these alloys is low. Therefore, the current density for magnetization switching caused by spin-polarized electrons may be considerably reduced. Thus, these alloys may be effectively applied to the interfacial magnetic layer 3.

If the interfacial magnetic layer 3 is epitaxially grown with respect to the nonmagnetic layer 4, a high MR ratio may be obtained. In this case, the thickness of the interfacial magnetic layer 3 that is in contact with the nonmagnetic layer 4 may be increased or decreased in the direction perpendicular to the film plane.

(Interfacial Magnetic Layer 6)

The interfacial magnetic layer 6 is a perpendicular magnetization film, and preferably formed of a material having high magnetic anisotropy energy Ku to maintain a high thermal stability factor Δ, and a high spin polarization. If the interfacial magnetic layer 6 is disposed on the reference layer side, it preferably has a low saturation magnetization to reduce the stray magnetic field applied to the storage layer. If the interfacial magnetic layer 6 is disposed on the storage layer side, it preferably has a low Gilbert damping factor to perform magnetization switching with a low current. Materials to meet these requirements will be specifically described below.

A first specific example of the material of the interfacial magnetic layer 6 is a MnGa alloy. In view of the requirements of saturation magnetization, perpendicular magnetic anisotropy, Gilbert damping factor, and spin polarization, at least one element selected from Al, Ge, Ir, Cr, Co, Pt, Ru, Pd, Rh, Ni, Fe, Re, Au, Cu, B, C, P, Gd, Tb, and Dy may be added to the MnGa alloy. As a result, a MnGaX magnetic film containing Mn, Ga, and at least one element selected from Al, Ge, Ir, Cr, Co, Pt, Ru, Pd, Rh, Ni, Fe, Re, Au, Cu, B, C, P, Gd, Tb, and Dy may be selected to form the interfacial magnetic layer 6. Specific examples of MnGaX are MnGaAl, MnGaGe, MnGaIr, MnGaCr, MnGaCo, MnGaPt, MnGaRu, MnGaPd, MnGaRh, MnGaNi, MnGaFe, MnGaRe, MnGaAu, MnGaCu, MnGaB, MnGaC, MnGaP, MnGaGd, MnGaTb, and MnGaDy.

A second specific example of the material of the interfacial magnetic layer 6 is a MnGe alloy. A MnGe alloy has an energy gap in the [001] direction with respect to either the up-spin or down-spin band, and therefore has a half-metallic characteristic, which allows the MnGe alloy to have a high MR ratio.

A third specific example of the material of the interfacial magnetic layer 6 is an alloy containing at least one element selected from Mn, Fe, Co, and Ni, and at least two elements selected from Zn, Al, Ga, In, Si, Ge, Sn, As, Sb, and Bi. Specific examples of such an alloy include MnAlGe and MnZnSb.

A fourth specific example of the material of the interfacial magnetic layer 6 is a MnAl alloy. A MnAl alloy includes a light element, and has a small Gilbert damping factor. Therefore, the energy needed for the magnetization switching is low, and the current density for switching the magnetization by means of the spin-polarized electrons may be considerably reduced. Furthermore, a MnAl alloy has an energy gap in the [001] direction with respect to either of the up-spin or down-spin band and therefore has a half-metallic characteristic and a high spin polarization. Due to this, the MnAl alloy may have a high MR ratio.

The aforementioned materials, MnGa, MnGaX, MnGe, MnAlGe, MnZnSb, and MnAl, for example, have characteristics to serve as a magnetization film if they have an appropriate composition range. In order to have the perpendicular magnetic anisotropy, the c-axis of these materials need to be oriented in the direction that is perpendicular to the film plane, i.e., the [001] direction. The crystal orientation of the interfacial magnetic layer 6 may be controlled by appropriately selecting the material of the nonmagnetic layer 4.

A fifth specific example of the interfacial magnetic layer 6 is an alloy containing a metal selected from Fe and Co. In order to control the saturation magnetization of the interfacial magnetic layer 6, at least one element selected from the group consisting of Ni, B, C, P, Ta, Ti, Mo, Si, W, Nb, Mn, Al, and Ge may be added to the material of the interfacial magnetic layer 6. In other words, the interfacial magnetic layer 6 may be formed of an alloy containing at least one element selected from the group consisting of Fe and Co, and at least one element selected from the group consisting of Ni, B, C, P, Ta, Ti, Mo, Si, W, Nb, Mn, Al, and Ge. Examples of such a material are CoFeSi, CoFeP, CoFeW, and CoFeNb besides CoFeB. These alloys have a high spin polarization like CoFeB. A Heusler metal such as $Co_2FeSi$, $Co_2MnSi$, $Co_2MnGe$, $Co_2MnAl$, $Co_2FeAl$, $Co_2(Fe, Mn)Si$, $Co_2(Fe, Mn)Al$ may also be used. Heusler metals have a spin polarization equivalent to or higher than that of CoFeB. Accordingly, Heusler metals are suitable to be used for interfacial magnetic layers.

Generally, there is a correlation between the Gilbert damping factor and the magnitude of spin orbit interaction of a material. A material with an element having a higher atomic number has greater spin orbit interaction, and a higher Gilbert damping factor. Since the materials of the aforementioned specific examples include light elements, the Gilbert damping factor of these materials is low. Therefore, the energy needed to perform magnetization switching may be low, and the current density required to switch the magnetization by means of spin-polarized electrons may be considerably reduced. Accordingly, these materials may be effectively used to form the interfacial magnetic layer 6.

Since a high MR ratio may be obtained as long as the interfacial magnetic layer 6 is epitaxially grown relative to the nonmagnetic layer 4, the thickness of the interfacial magnetic layer 6 that is in contact with the nonmagnetic layer 4 may be increased or decreased in the direction perpendicular to the film plane.

(Sixth Embodiment)

A magnetic memory (MRAM) of spin transfer writing type according to a sixth embodiment will be described below.

Figure 13:
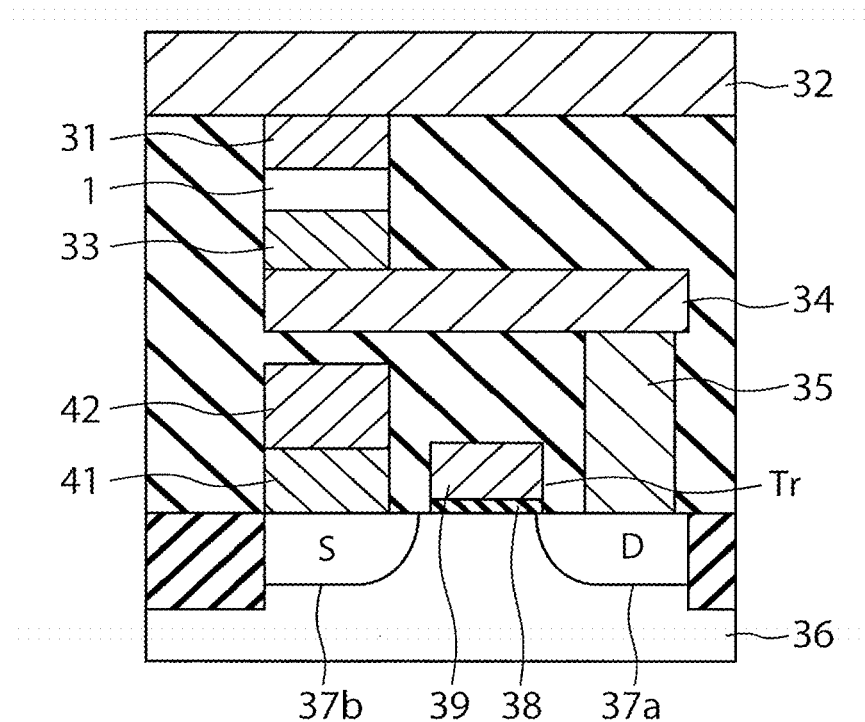
FIG. 13 is a cross-sectional view illustrating a memory cell of a magnetic memory according to a sixth embodiment.

The MRAM according to the sixth embodiment includes a plurality of memory cells. FIG. 13 is a sectional view of a main part of one of the memory cells of the MRAM according to the sixth embodiment. The memory cell includes a magnetoresistive element according to any of the first to fifth embodiments and their modifications as a storage element. In the descriptions of the sixth embodiment, the storage element is the magnetoresistive element (MTJ element) according to the first embodiment.

As shown in FIG. 13, the top surface of the MTJ element 1 is connected to a bit line 32 via an upper electrode 31. The lower surface of the MTJ element 1 is connected, via a lower electrode 33, an extraction electrode 34, and a plug 35, to a drain region 37a of the source/drain regions formed near the surface of a semiconductor substrate 36. The drain region 37a constitutes a selection transistor Tr with a source region 37b, a gate insulating film 38 disposed on the substrate 36, and a gate electrode 39 disposed on the gate insulating film 38. The selection transistor Tr and the MTJ element 1 constitute one memory cell of the MRAM. The source region 37b is connected to another bit line 42 via a plug 41. The extraction electrode 34 may be omitted, and the plug 35 may be disposed under the lower electrode 33 and directly connected to the lower electrode 33. The bit lines 32 and 42, the electrodes 31 and 33, the extraction electrode 34, and the plugs 35 and 41 are formed of such materials as W, Al, AlCu, and Cu.

Figure 14:
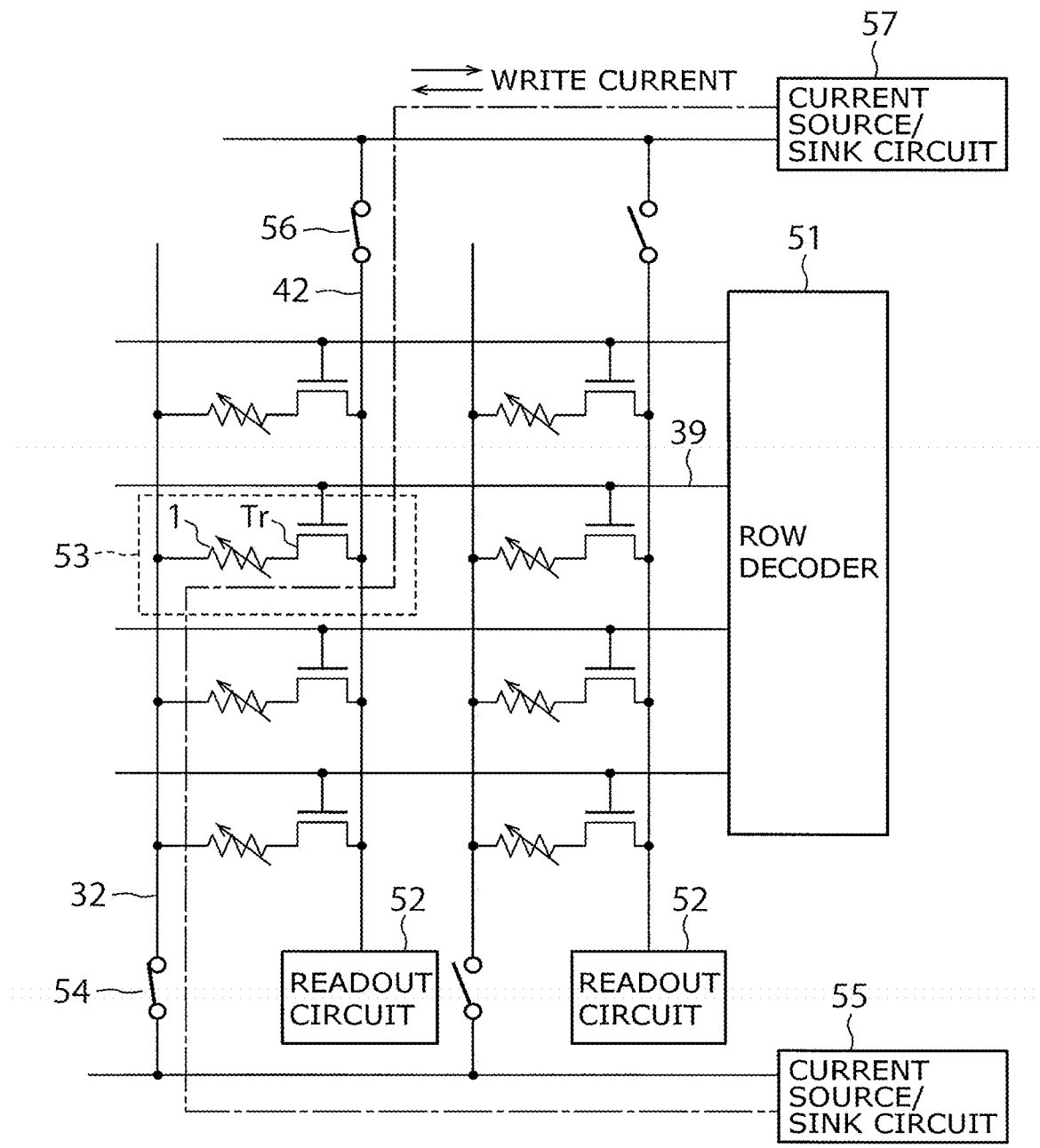
FIG. 14 is a circuit diagram of a main part of the magnetic memory according to the sixth embodiment.

In the MRAM according to the sixth embodiment, a plurality of memory cells, each being the one shown in FIG. 13, are disposed in rows and columns to form a memory cell array of the MRAM. FIG. 14 is a circuit diagram showing a main part of the MRAM according to the sixth embodiment.

FIG. 14 shows that a plurality of memory cells 53 each including the MTJ element 1 and a selection transistor Tr are arranged in a matrix form. A first terminal of each of the memory cells 53 in the same column is connected to the same bit line 32, and a second terminal is connected to the same bit line 42. The gate electrodes (word line) 39 of the selection transistors Tr of the memory cells 53 in the same row are mutually connected, and further connected to a row decoder 51.

The bit line 32 is connected to a current source/current sink circuit 55 via a switch circuit 54 such as a transistor. The bit line 42 is connected to a current source/current sink circuit 57 via a switch circuit 56 such as a transistor. The current source/current sink circuits 55 and 57 supply a write current to the bit lines 32 and 42 connected to them, and extract a current from the bit lines 32 and 42.

The bit line 42 is also connected to a readout circuit 52. The readout circuit 52 may be connected to the bit line 32. The readout circuit 52 includes a read current circuit and a sense amplifier.

In a write operation, a current path passing through a target memory cell is formed by turning on the switch circuits and 56 connected to the target memory cell and the selection transistor Tr. One of the current source/current sink circuits 55 and 57 serves as a current source circuit, and the other serves as a current sink circuit. The roles are determined depending on the information to be written. A write current flows in a direction determined according to the information to be written.

With respect to the write speed, the spin transfer torque writing may be performed with a current having a pulse width of several nanoseconds to several microseconds.

In a read operation, a read current that is low enough to prevent magnetization switching is supplied from a read current circuit to an MTJ element 1 determined in the same manner as the write operation. The sense amplifier of the readout circuit 52 determines the resistance state of the MR element by comparing, with a reference value, a current value or voltage value derived from the resistance value that depends on the magnetization state of the MTJ element.

The current pulse width in a read operation is preferably narrower than that in a write operation. The occurrence of writing errors caused by a current in a read operation may be reduced in this manner. This is based on the fact that the narrower the pulse width of a write current is, the greater the absolute value of the write current value becomes.

As described above, according to the sixth embodiment, a magnetic memory including a magnetoresistive element with low saturation magnetization, high perpendicular magnetic anisotropy and high MR ratio may be obtained.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A magnetoresistive element comprising:
a first magnetic layer;
a second magnetic layer;
a first nonmagnetic layer disposed between the first magnetic layer and the second magnetic layer;
a third magnetic layer disposed between the first magnetic layer and the first nonmagnetic layer; and
a layer having an amorphous structure, the layer containing two or more elements that are contained in the first magnetic layer, the layer being disposed between the first magnetic layer and the third magnetic layer,
wherein the first magnetic layer contains Mn and at least one element of Al, Ge, or Ga.

2. The magnetoresistive element according to claim 1, wherein the layer has a thickness of 0.1 nm or more and 5 nm or less.

3. The magnetoresistive element according to claim 1, further comprising a fourth magnetic layer disposed between the second magnetic layer and the first nonmagnetic layer.

4. A magnetic memory comprising:
the magnetoresistive element according to claim 1;
a first wiring electrically connected to the first magnetic layer of the magnetoresistive element; and
a second wiring electrically connected to the second magnetic layer of the magnetoresistive element.

5. The magnetoresistive element according to claim 1, wherein the first magnetic layer contains at least Mn and Al.

6. The magnetoresistive element according to claim 1, wherein the first magnetic layer contains at least Mn and Ge.

7. The magnetoresistive element according to claim 1, wherein the first magnetic layer contains at least Mn and Ga.

8. A magnetoresistive element comprising:
a first magnetic layer:
a second magnetic layer;
a first nonmagnetic layer disposed between the first magnetic layer and the second magnetic layer;
a third magnetic layer disposed between the first magnetic layer and the first nonmagnetic layer; and
a layer having an amorphous structure, the layer containing two or more elements that are contained in the first magnetic layer, the layer being disposed between the first magnetic layer and the third magnetic layer,
wherein the first magnetic layer contains Mn, Ga, and at least one element of Al, Ge, Ir, Cr, Co, Pt, Ru, Pd, Rh, Ni, Fe, Re, Au, Cu, B, C, P, Gd, Tb, or Dy.

9. The magnetoresistive element according to claim 8, wherein the layer has a thickness of 0.1 nm or more and 5 nm or less.

10. The magnetoresistive element according to claim 8, further comprising a fourth magnetic layer disposed between the second magnetic layer and the first nonmagnetic layer.

11. A magnetic memory comprising:
the magnetoresistive element according to claim 8;
a first wiring electrically connected to the first magnetic layer of the magnetoresistive element; and
a second wiring electrically connected to the second magnetic layer of the magnetoresistive element.

12. A magnetoresistive element comprising:
a first magnetic layer;
a second magnetic layer;
a first nonmagnetic layer disposed between the first magnetic layer and the second magnetic layer; and
a layer having an amorphous structure, the layer containing two or more elements that are contained in the first magnetic layer, the layer being disposed between the first magnetic layer and the first nonmagnetic layer,
wherein the first magnetic layer contains Mn and at least one element of AL, Ge, or Ga.

13. The magnetoresistive element according to claim 12, wherein the layer has a thickness of 0.1 nm or more and 1 nm or less.

14. The magnetoresistive element according to claim 12, further comprising a fourth magnetic layer disposed between the second magnetic layer and the first nonmagnetic layer.

15. A magnetic memory comprising:
the magnetoresistive element according to claim 12;
a first wiring electrically connected to the first magnetic layer of the magnetoresistive element; and a second wiring electrically connected to the second magnetic layer of the magnetoresistive element.

16. A magnetoresistive element comprising:
a first magnetic layer:
a second magnetic layer;
a first nonmagnetic layer disposed between the first magnetic layer and the second magnetic layer; and
a layer having an amorphous structure, the layer containing two or more elements that are contained in the first magnetic layer, the layer being disposed between the first magnetic layer and the first nonmagnetic layer,
wherein the first magnetic layer contains Mn, Ga, and at least one element of Al, Ge, Ir, Cr, Co, Pt, Ru, Pd, Rh, Ni, Fe, Re, Au, Cu, B, C, P, Gd, Tb, or Dy.

17. The magnetoresistive element according to claim 16, wherein the layer has a thickness of 0.1 nm or more and 1 nm or less.

18. The magnetoresistive element according to claim 16, further comprising a fourth magnetic layer disposed between the second magnetic layer and the first nonmagnetic layer.

19. A magnetic memory comprising:
the magnetoresistive element according to claim 16;
a first wiring electrically connected to the first magnetic layer of the magnetoresistive element; and
a second wiring electrically connected to the second magnetic layer of the magnetoresistive element.

* * * * *